US011249151B2

(12) United States Patent
Saito

(10) Patent No.: US 11,249,151 B2
(45) Date of Patent: Feb. 15, 2022

(54) MAGNETIC DETECTOR AND METHOD FOR PRODUCING THE SAME

(71) Applicant: Alps Alpine Co., Ltd., Tokyo (JP)

(72) Inventor: Masamichi Saito, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 21 days.

(21) Appl. No.: 16/929,812

(22) Filed: Jul. 15, 2020

(65) Prior Publication Data

US 2020/0348375 A1    Nov. 5, 2020

Related U.S. Application Data

(63) Continuation of application No. PCT/JP2018/047858, filed on Dec. 26, 2018.

(30) Foreign Application Priority Data

Jan. 17, 2018 (JP) .............................. JP2018-005459

(51) Int. Cl.
| | | |
|---|---|---|
| G01R 33/09 | (2006.01) |
| G01R 33/00 | (2006.01) |
| H01L 43/08 | (2006.01) |
| H01L 43/10 | (2006.01) |
| H01L 43/12 | (2006.01) |

(52) U.S. Cl.
CPC ....... *G01R 33/093* (2013.01); *G01R 33/0017* (2013.01); *G01R 33/0052* (2013.01); *G01R 33/0076* (2013.01); *G01R 33/098* (2013.01); *H01L 43/08* (2013.01); *H01L 43/10* (2013.01); *H01L 43/12* (2013.01)

(58) Field of Classification Search
CPC .............. G01R 33/093; G01R 33/0017; G01R 33/0052; G01R 33/0076; G01R 33/098
See application file for complete search history.

(56) References Cited

U.S. PATENT DOCUMENTS

| | | | |
|---|---|---|---|
| 9,123,877 B2 | 9/2015 | Lei et al. | |
| 10,107,871 B2 * | 10/2018 | Deak | ........................ H01L 43/12 |

(Continued)

FOREIGN PATENT DOCUMENTS

| | | |
|---|---|---|
| JP | H 9-147326 | 6/1997 |
| JP | 2002-353417 | 12/2002 |

(Continued)

OTHER PUBLICATIONS

International Search Report from corresponding International Application No. PCT/JP2018/047858, 5pgs, dated Dec. 12, 2019.

*Primary Examiner* — Reena Aurora
(74) *Attorney, Agent, or Firm* — Crowell & Moring LLP

(57) ABSTRACT

A magnetic detector includes a full-bridge circuit including magnetoresistive sensors on the same substrate. The magnetoresistive sensors include two magnetoresistive films and have different relationships between the fixed magnetization direction and the bias application direction. The fixed magnetization direction and the bias application direction are determined with three or more exchange coupling films including antiferromagnetic layers with different blocking temperatures. Thus, the magnetic detector has high resistance to a strong magnetic field, is easy to produce, and has a high degree of flexibility in production.

21 Claims, 17 Drawing Sheets

(56) References Cited

U.S. PATENT DOCUMENTS

| | | | |
|---|---|---|---|
| 2006/0127701 A1 | 6/2006 | Ruigrok et al. | |
| 2009/0059444 A1 | 3/2009 | Mather | |
| 2017/0328963 A1* | 11/2017 | Schmitt | G01R 33/098 |
| 2018/0356474 A1* | 12/2018 | Hammerschmidt | H01L 43/10 |
| 2020/0348374 A1* | 11/2020 | Saito | G01R 33/093 |

FOREIGN PATENT DOCUMENTS

| | | |
|---|---|---|
| JP | 2003-067904 | 3/2003 |
| JP | 2003-069109 | 3/2003 |
| JP | 2006-527497 | 11/2006 |
| JP | 2008-286739 | 11/2008 |
| JP | 2014-516406 | 7/2014 |

* cited by examiner

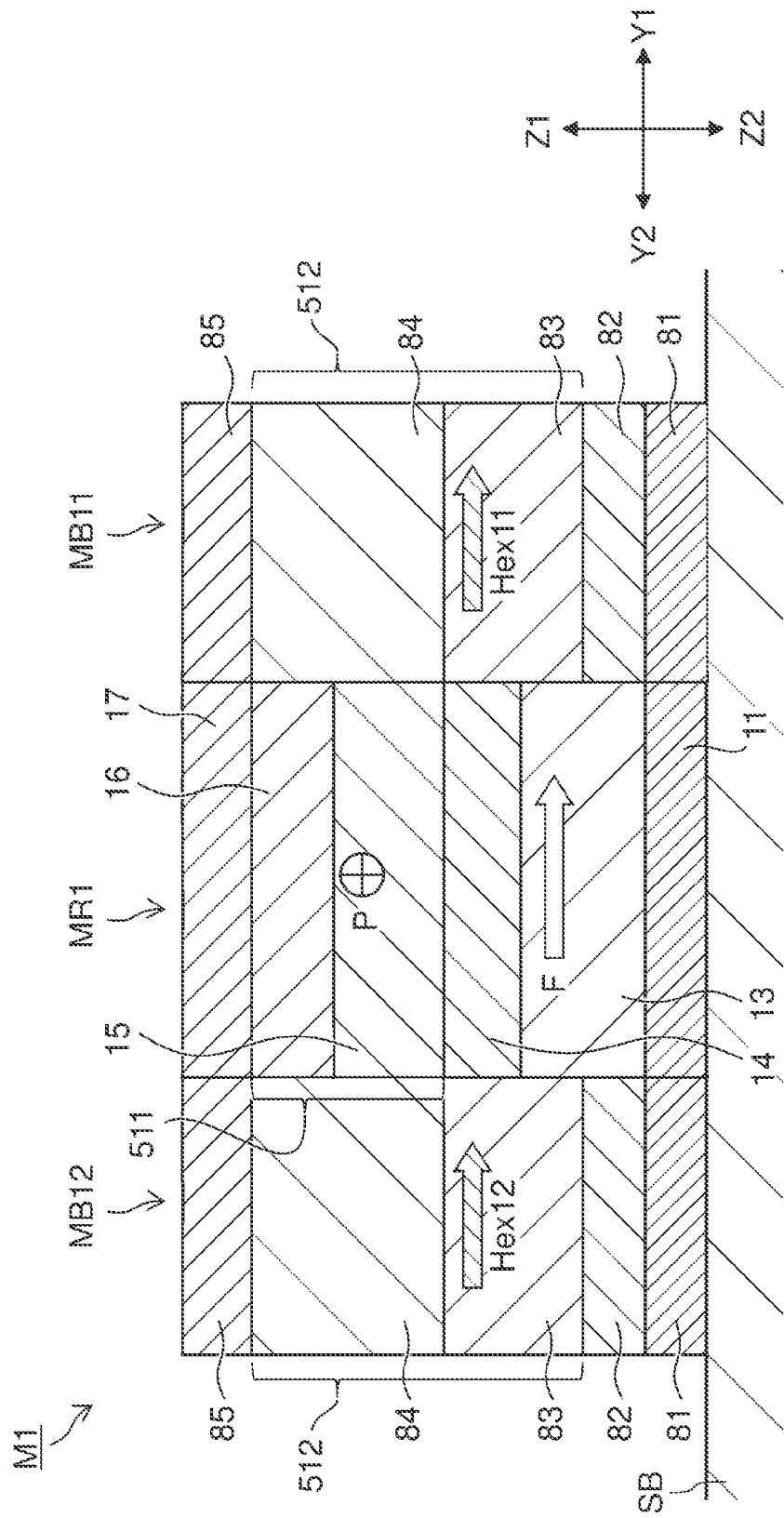

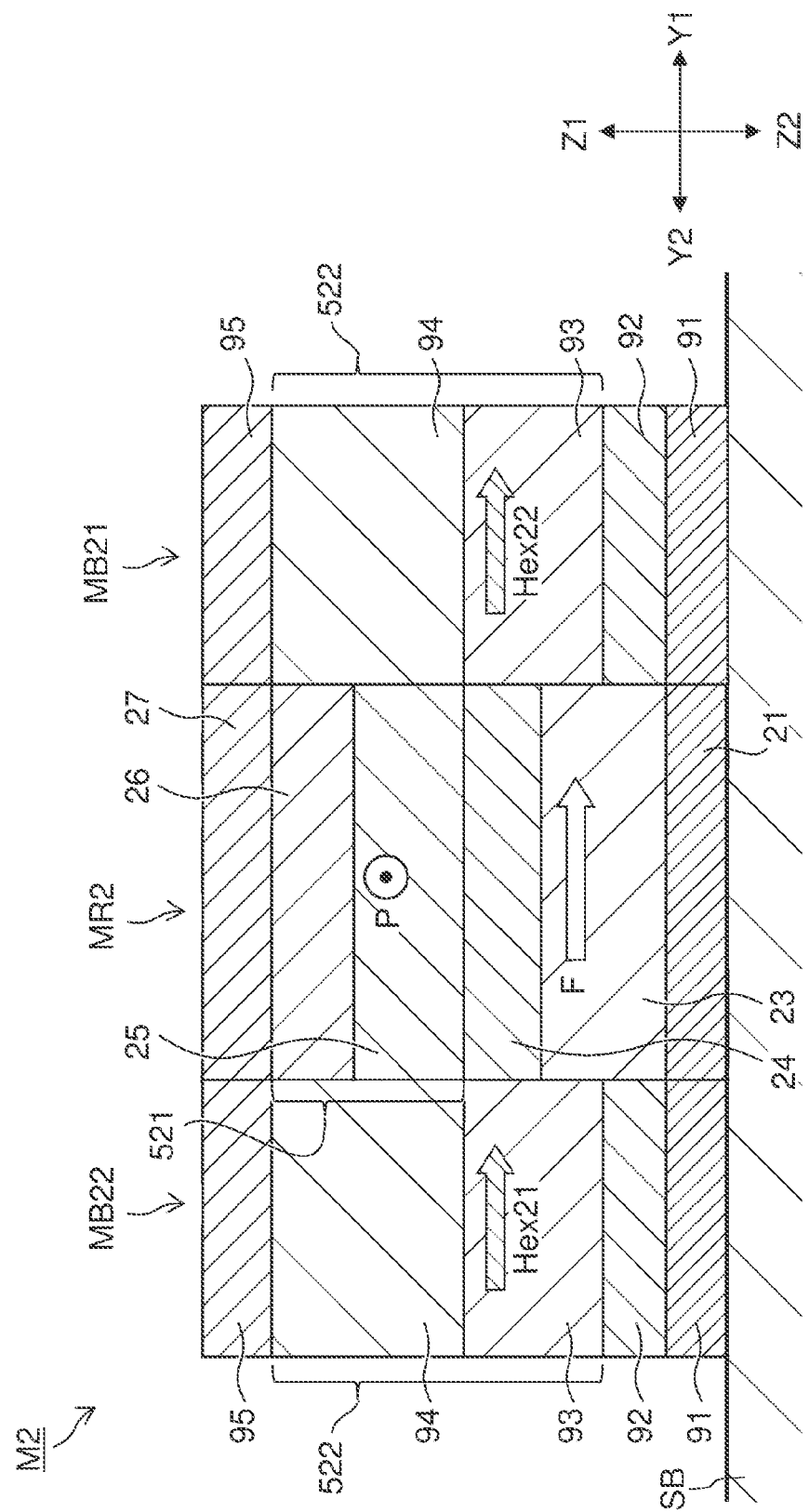

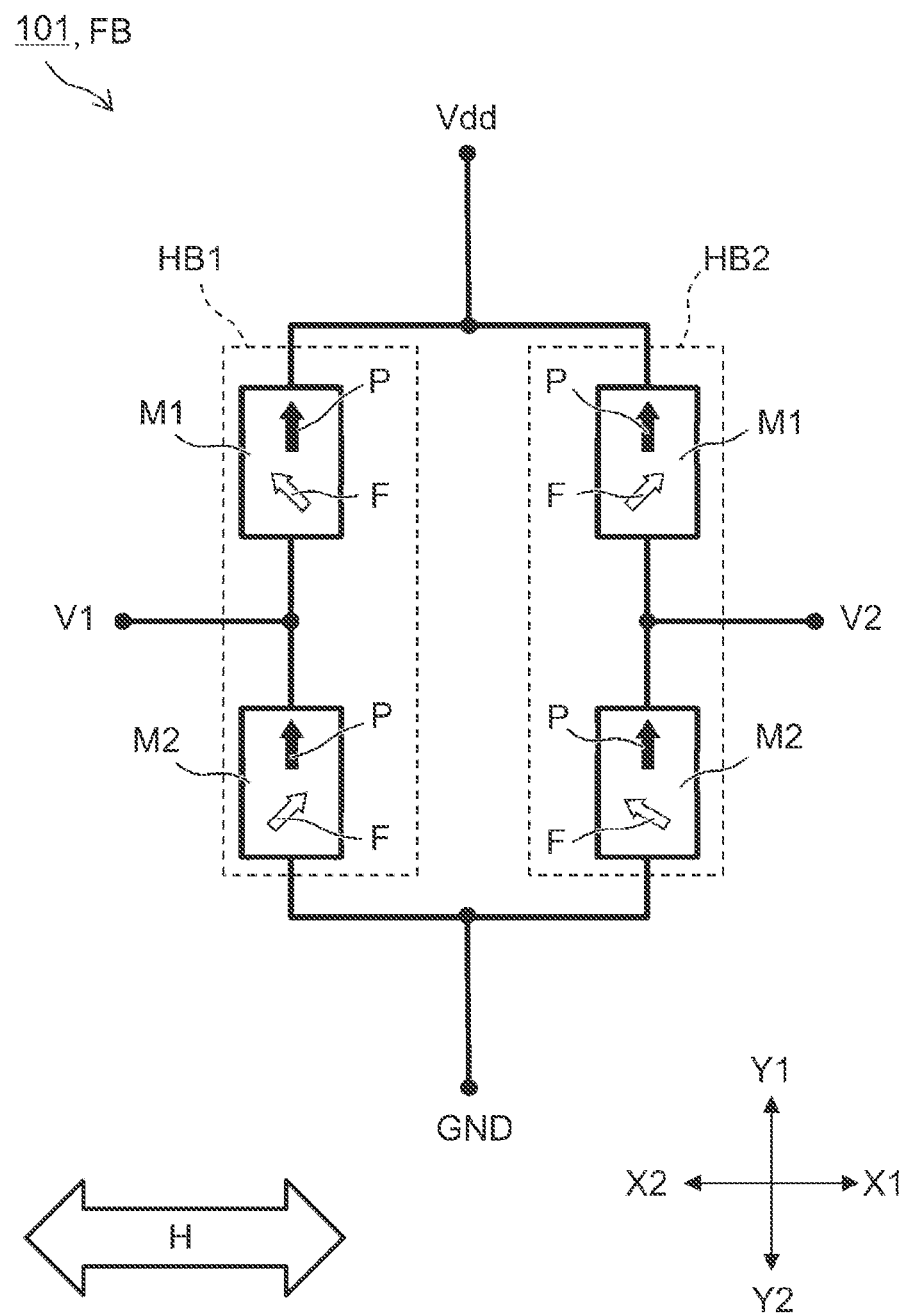

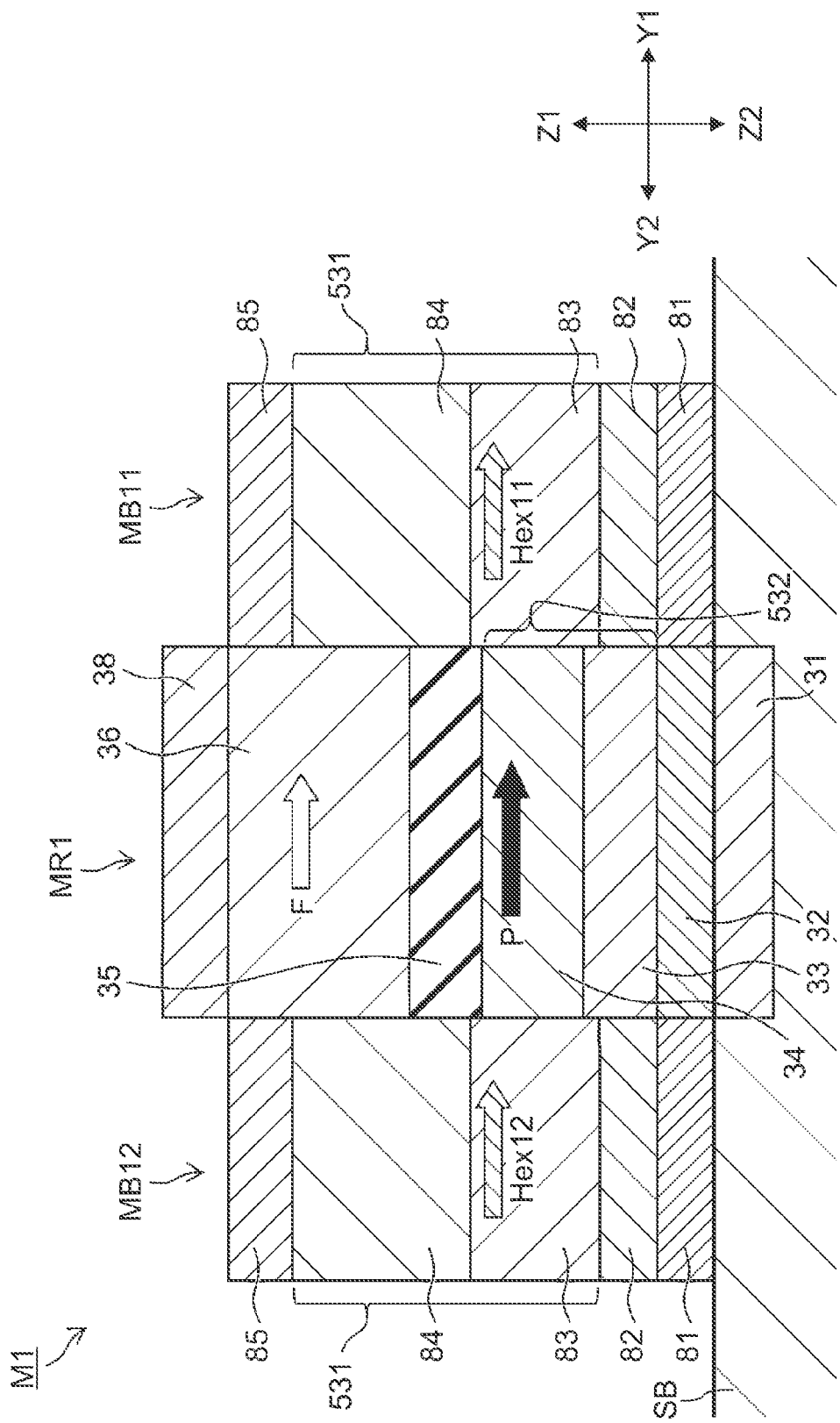

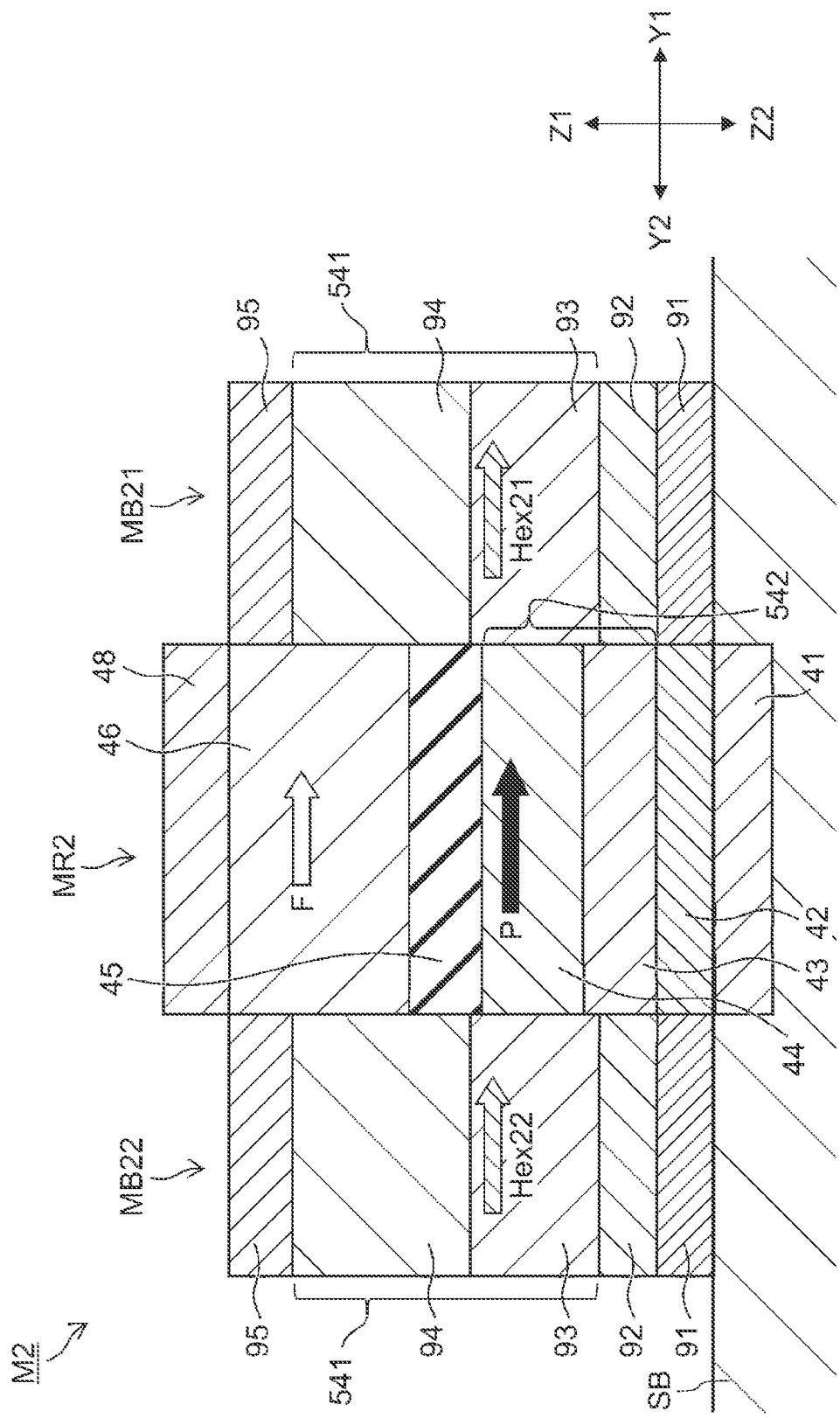

MAGNETIC DETECTOR AND METHOD FOR PRODUCING THE SAME

CLAIM OF PRIORITY

This application is a Continuation of International Application No. PCT/JP2018/047858 filed on Dec. 26, 2018, which claims benefit of priority to Japanese Patent Application No. 2018-005459 filed on Jan. 17, 2018. The entire contents of each application noted above are hereby incorporated by reference.

BACKGROUND

1. Field of the Disclosure

The present disclosure relates to a magnetic detector that includes a full-bridge circuit including a plurality of magnetoresistive sensors with a magnetoresistive film and a method for producing the magnetic detector.

2. Description of the Related Art

Magnetic detectors (magnetic sensors) that include a magnetoresistive sensor with a magnetoresistive film having a pinned magnetic layer and a free magnetic layer are used in various fields, such as magnetic field sensors, position sensors, and electric current sensors. To improve the detection accuracy and broaden the measurable range of such sensors, some magnetic sensors include a full-bridge circuit (Wheatstone bridge circuit) composed of half-bridge circuits connected in parallel. The half-bridge circuits each include two magnetoresistive sensors with different responsiveness to an external magnetic field connected in series. The two magnetoresistive sensors in the full-bridge circuit typically have different relative relationships between the magnetization direction and the sensitivity axis direction of the free magnetic layer in the absence of an external magnetic field and therefore have different responsiveness to an external magnetic field.

For example, Japanese Unexamined Patent Application Publication No. 2006-527497 discloses two magnetoresistive sensors with antiparallel fixed magnetization axes. PCT Japanese Translation Patent Publication No. 2014-516406 discloses two magnetoresistive sensors that have fixed magnetization axes in the same direction and include free magnetic layers to which a bias magnetic field is applied in different directions.

In Japanese Unexamined Patent Application Publication No. 2006-527497, in order to differentiate the directions of the fixed magnetization axes of a plurality of magnetoresistive sensors on a substrate, at least one of the magnetoresistive sensors is selectively heated by applying an electric current in a magnetic field to heat an antiferromagnetic layer of the magnetoresistive sensor(s) to its blocking temperature or higher and adjust the magnetization direction of the antiferromagnetic layer to the magnetization direction of the pinned magnetic layer parallel to the external magnetic field application direction, thereby setting the fixed magnetization axis of the heated magnetoresistive sensor in the desired direction.

In PCT Japanese Translation Patent Publication No. 2014-516406, the two magnetoresistive sensors with the fixed magnetization axes in the same direction are formed on the same substrate, wherein the free magnetic layers in the absence of an external magnetic field have different directions. A method for controlling the direction of the free magnetic layer described therein utilizes the shape anisotropy of a magnetoresistive film, utilizes a bias magnetic field of a permanent magnet, or includes placing an antiferromagnetic layer on the free magnetic layer to generate an exchange coupling magnetic field, for example.

SUMMARY

In one aspect of the disclosure, a magnetic detector that includes a full-bridge circuit including a first magnetoresistive sensor and a second magnetoresistive sensor. The first magnetoresistive sensor includes a first magnetoresistive film and a first magnetic field application bias film, the first magnetoresistive film including a first pinned magnetic layer and a first free magnetic layer. The first magnetic field application bias film is configured to apply a bias magnetic field to the first free magnetic layer. The second magnetoresistive sensor includes a second magnetoresistive film and a second magnetic field application bias film, the second magnetoresistive film including a second pinned magnetic layer and a second free magnetic layer. The second magnetic field application bias film is configured to apply a bias magnetic field to the second free magnetic layer. The full-bridge circuit includes a first half-bridge circuit and a second half-bridge circuit connected in parallel between a power supply terminal and a ground terminal. The first half-bridge circuit includes the first magnetoresistive sensor and the second magnetoresistive sensor connected in series. The second half-bridge circuit includes the second magnetoresistive sensor and the first magnetoresistive sensor connected in series. The first magnetoresistive sensor and the second magnetoresistive sensor are located on the same substrate.

The first magnetoresistive film has a first pinning exchange coupling film including the first pinned magnetic layer and a first pinning antiferromagnetic layer, the first magnetic field application bias film has a first biasing exchange coupling film including a first ferromagnetic layer and a first biasing antiferromagnetic layer. The second magnetoresistive film has a second pinning exchange coupling film including the second pinned magnetic layer and a second pinning antiferromagnetic layer The second magnetic field application bias film has a second biasing exchange coupling film including a second ferromagnetic layer and a second biasing antiferromagnetic layer. The first pinned magnetic layer has a fixed magnetization axis coaxial with a fixed magnetization axis of the second pinned magnetic layer. The first biasing exchange coupling film has an exchange coupling magnetic field direction nonparallel to a fixed magnetization axis direction of the first pinned magnetic layer, and the second biasing exchange coupling film has an exchange coupling magnetic field direction nonparallel to a fixed magnetization axis direction of the second pinned magnetic layer. Each of a blocking temperature Tbf1 of the first pinning antiferromagnetic layer and a blocking temperature Tbf2 of the second pinning antiferromagnetic layer is higher than a blocking temperature Tb1 of the first biasing antiferromagnetic layer and a blocking temperature Tb2 of the second biasing antiferromagnetic layer, and the blocking temperature Tb1 of the first biasing antiferromagnetic layer is higher than the blocking temperature Tb2 of the second biasing antiferromagnetic layer.

As described above, at least three antiferromagnetic layers with different blocking temperatures Tbs can be used to flexibly determine the fixed magnetization axis direction and the bias magnetic field application direction in the free magnetic layer in two magnetoresistive devices. Furthermore, both the fixed magnetization axis and the bias magnetic field are set using an exchange coupling magnetic field between an antiferromagnetic layer and a ferromagnetic layer. This increases resistance to a strong magnetic field. Furthermore, two adjacent magnetoresistive devices have little influence on each other. Thus, the magnetic detector can be miniaturized compared with the case where the bias magnetic field is set with a permanent magnet, for example.

In another aspect, a method for producing a magnetic detector including a full-bridge circuit includes a first magnetoresistive sensor and a second magnetoresistive sensor, the first magnetoresistive sensor including a first magnetoresistive film and a first magnetic field application bias film. The first magnetoresistive film includes a first pinned magnetic layer and a first free magnetic layer. The first magnetic field application bias film is configured to apply a bias magnetic field to the first free magnetic layer. The second magnetoresistive sensor including a second magnetoresistive film and a second magnetic field application bias film. The second magnetoresistive film includes a second pinned magnetic layer and a second free magnetic layer. The second magnetic field application bias film is configured to apply a bias magnetic field to the second free magnetic layer. In the magnetic detector, the full-bridge circuit includes a first half-bridge circuit and a second half-bridge circuit connected in parallel between a power supply terminal and a ground terminal The first half-bridge circuit includes the first magnetoresistive sensor and the second magnetoresistive sensor connected in series.

The second half-bridge circuit includes the second magnetoresistive sensor and the first magnetoresistive sensor connected in series. The first magnetoresistive sensor and the second magnetoresistive sensor are located on the same substrate. The first magnetoresistive film has a first pinning exchange coupling film including the first pinned magnetic layer and a first pinning antiferromagnetic layer. The first magnetic field application bias film has a first biasing exchange coupling film including a first ferromagnetic layer and a first biasing antiferromagnetic layer. The second magnetoresistive film has a second pinning exchange coupling film including the second pinned magnetic layer and a second pinning antiferromagnetic layer. The second magnetic field application bias film has a second biasing exchange coupling film including a second ferromagnetic layer and a second biasing antiferromagnetic layer Each of a blocking temperature $Tbf1$ of the first pinning antiferromagnetic layer and a blocking temperature $Tbf2$ of the second pinning antiferromagnetic layer is higher than a blocking temperature $Tb1$ of the first biasing antiferromagnetic layer and a blocking temperature $Tb2$ of the second biasing antiferromagnetic layer, and the blocking temperature $Tb1$ of the first biasing antiferromagnetic layer is higher than the blocking temperature $Tb2$ of the second biasing antiferromagnetic layer. The production method includes a fixed magnetization axis setting step of ordering the first pinning antiferromagnetic layer and the second pinning antiferromagnetic layer by heat treatment to generate an exchange coupling magnetic field in the first biasing exchange coupling film and in the second biasing exchange coupling film, thereby making a fixed magnetization axis of the first pinned magnetic layer coaxial with a fixed magnetization axis of the second pinned magnetic layer, a first bias magnetic field setting step of making a direction of a bias magnetic field generated by the first biasing exchange coupling film nonparallel to a fixed magnetization axis direction of the first pinned magnetic layer by heat treatment in an external magnetic field at a temperature lower than a blocking temperature $Tbf1$ of the first pinning antiferromagnetic layer and a blocking temperature $Tbf2$ of the second pinning antiferromagnetic layer, and after the first bias magnetic field setting step, a second bias magnetic field setting step of making a direction of a bias magnetic field generated by the second biasing exchange coupling film nonparallel to a fixed magnetization axis direction of the second pinned magnetic layer by heat treatment in an external magnetic field at a temperature lower than the blocking temperature $Tb1$ of the first biasing antiferromagnetic layer.

The production method enables the production of a magnetic detector that includes a full-bridge circuit (Wheatstone bridge circuit) including two magnetoresistive sensors with different responsiveness to an external magnetic field on the same substrate and that has high resistance to a strong magnetic field without the step of applying an external magnetic field to each magnetoresistive sensor.

The present invention can provide a magnetic detector that includes a full-bridge circuit including two magnetoresistive sensors with different responsiveness to an external magnetic field on the same substrate and that has high resistance to a strong magnetic field. The present invention can also provide a method for producing the magnetic detector.

BRIEF DESCRIPTION OF THE DRAWINGS

FIG. 4A is a cross-sectional view taken along the line IVA-IVA of FIG. 3A;

FIG. 4B is a cross-sectional view taken along the line IVB-IVB of FIG. 3B;

FIG. 9 is a circuit block diagram of a magnetic sensor according to a second embodiment of the present invention;

FIG. 11A is a cross-sectional view taken along the line XIA-XIA of FIG. 10A;

FIG. 11B is a cross-sectional view taken along the line XIB-XIB of FIG. 10B;

DESCRIPTION OF THE EXEMPLARY EMBODIMENTS

Figure 1:
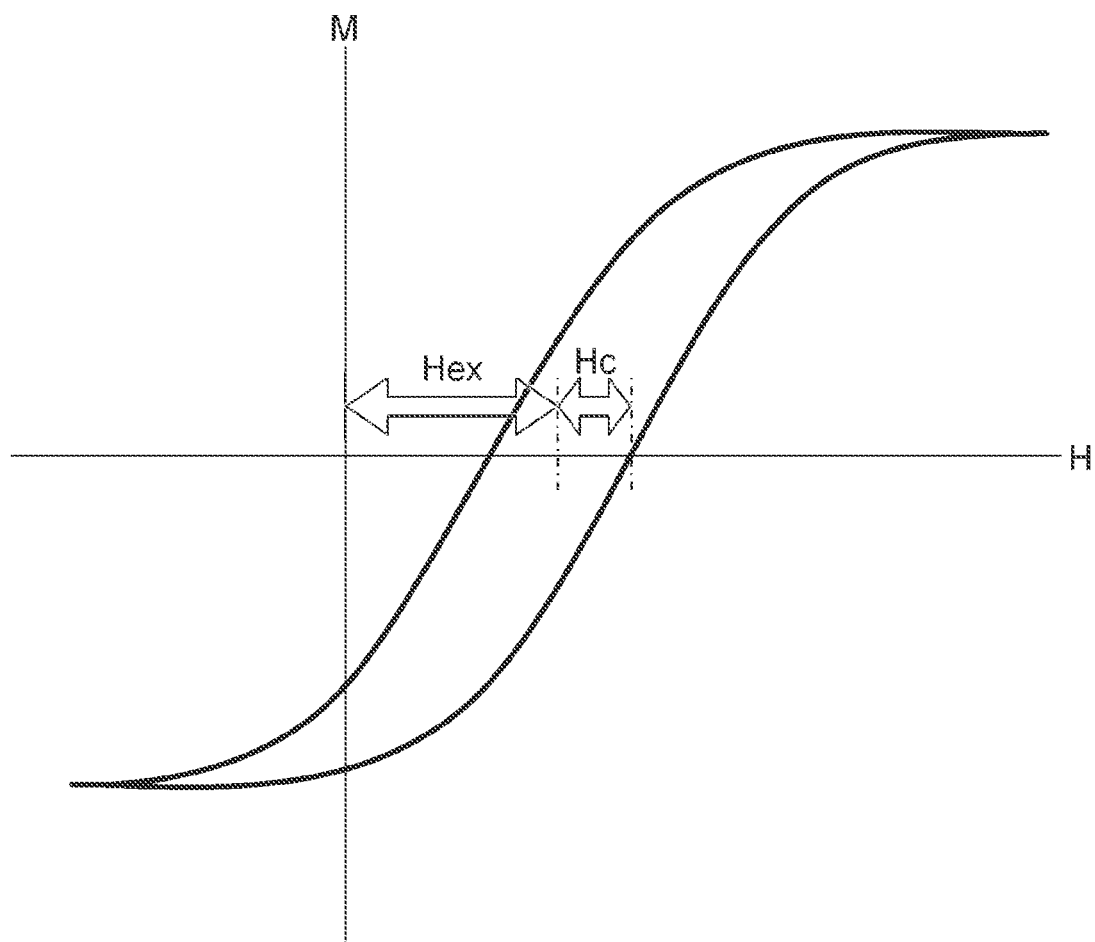
FIG. 1 is an explanatory view of a hysteresis loop of a magnetization curve of a magnetic field application bias film according to the present invention.

FIG. 1 is an explanatory view of a hysteresis loop of a magnetization curve of an exchange coupling film with the pinning antiferromagnetic layer. A hysteresis loop of an M-H curve (magnetization curve) of a soft magnetic material is typically symmetric about a point of intersection between an H axis and an M axis (magnetic field H=0 A/m, magnetization M=0 A/m). As illustrated in FIG. 1, however, a hysteresis loop of the exchange coupling film shifts along the H axis depending on an exchange coupling magnetic field Hex acting on a ferromagnetic layer exchange-coupled with the pinning antiferromagnetic layer. The magnetization reversal of the pinning ferromagnetic layer of the exchange coupling film becomes more difficult even in an external magnetic field as the exchange coupling magnetic field Hex increases. Thus, a magnetic detector with such a pinning antiferromagnetic layer has high resistance to a strong magnetic field.

Furthermore, the pinning antiferromagnetic layer has a higher blocking temperature Tb than an antiferromagnetic layer formed of a known antiferromagnetic material, such as IrMn or PtMn, as described in Japanese Unexamined Patent Application Publication No. 2006-527497, and can maintain the exchange coupling magnetic field Hex, for example, even at approximately 350° C. in an external magnetic field.

Figure 2:
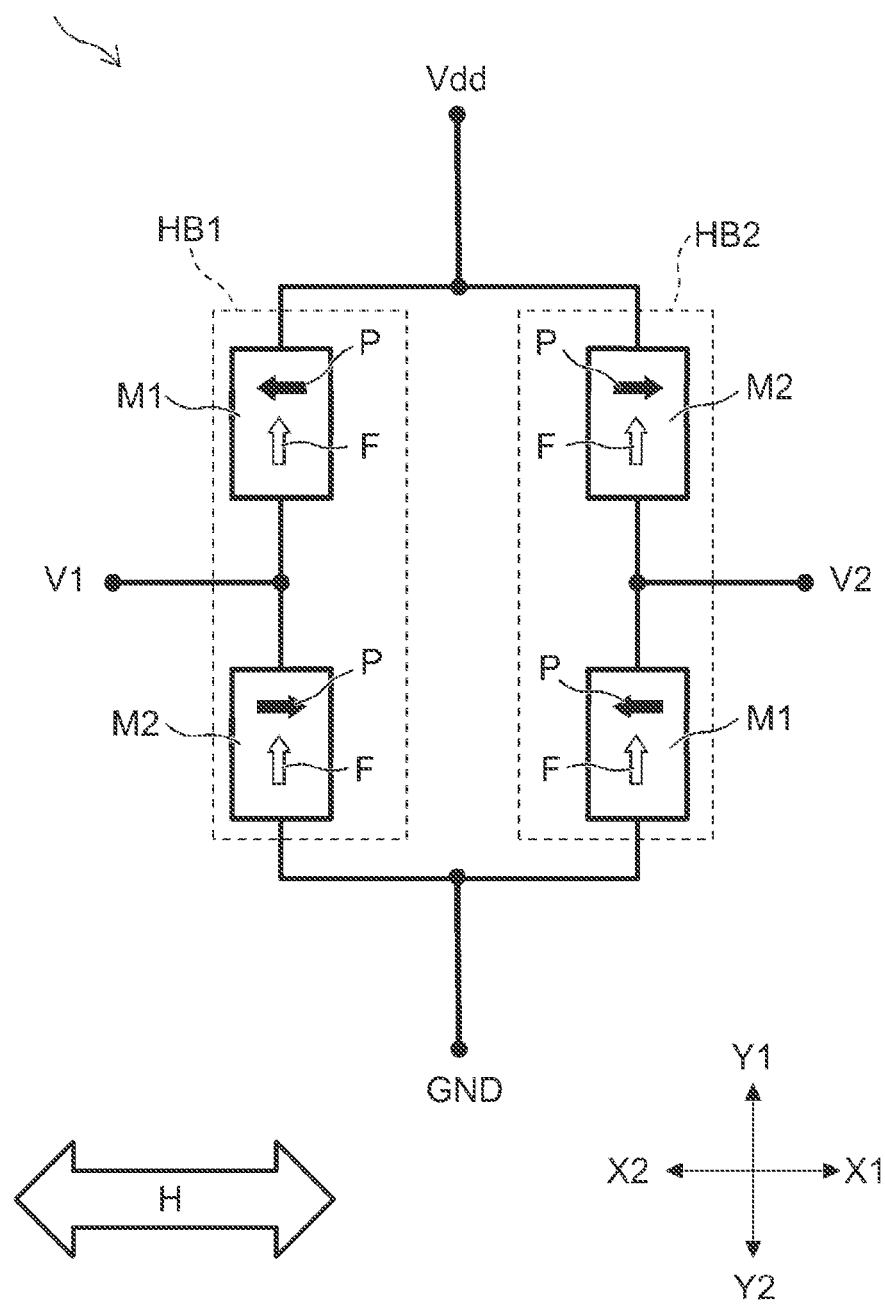
FIG. 2 is a circuit block diagram of a magnetic sensor according to a first embodiment of the present invention.
Figure 3A:
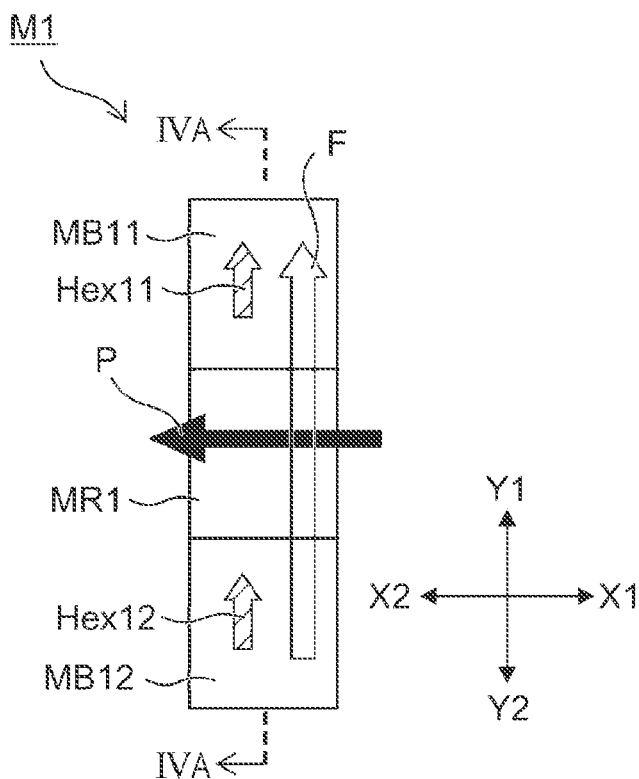
FIG. 3A is an explanatory view of a first magnetoresistive sensor according to the first embodiment of the present invention viewed along a Z1-Z2 axis.
Figure 3B:
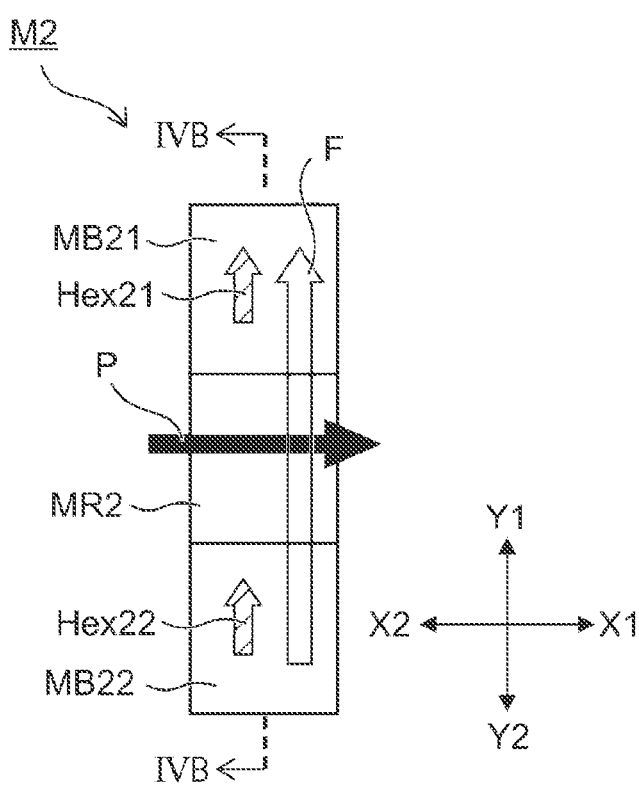
FIG. 3B is an explanatory view of a second magnetoresistive sensor according to the first embodiment of the present invention viewed along the Z1-Z2 axis.

FIG. 2 is a circuit block diagram of a magnetic sensor (magnetic detector) according to a first embodiment of the present invention. FIG. 3A is an explanatory view of a first magnetoresistive sensor according to the first embodiment of the present invention viewed along a Z1-Z2 axis. FIG. 3B is an explanatory view of a second magnetoresistive sensor according to the first embodiment of the present invention viewed along the Z1-Z2 axis. FIG. 4A is a cross-sectional view taken along the line IVA-IVA of FIG. 3A. FIG. 4B is a cross-sectional view taken along the line IVB-IVB of FIG. 3B.

As illustrated in FIG. 2, a magnetic sensor 100 includes a full-bridge circuit FB composed of a first half-bridge circuit HB1 and a second half-bridge circuit HB2 connected in parallel between a power supply terminal Vdd and a ground terminal GND. The first half-bridge circuit HB1 is composed of a first magnetoresistive sensor M1 and a second magnetoresistive sensor M2 connected in series, and the second half-bridge circuit HB2 is composed of the second magnetoresistive sensor M2 and the first magnetoresistive sensor M1 connected in series. The first magnetoresistive sensor M1 and the second magnetoresistive sensor M2 are located on the same substrate SB.

The differential output (OutX1)−(OutX2) between the output electric potential (OutX1) of the first half-bridge circuit HB1 at a midpoint V1 and the output electric potential (OutX2) of the second half-bridge circuit HB2 at a midpoint V2 in the full-bridge circuit FB is obtained as the detection output (detection output voltage) VXs along an X1-X2 axis.

The first magnetoresistive sensor M1 includes a first magnetoresistive film MR1. The first magnetoresistive film MR1 is a giant magnetoresistive film including a first pinned magnetic layer 15 with fixed magnetization in the X2 direction on the X1-X2 axis (in a fixed magnetization direction P) and a first free magnetic layer 13 that is easily magnetized along an external magnetic field H applied.

The first pinned magnetic layer 15 and a first pinning antiferromagnetic layer 16 constitute a first pinning exchange coupling film 511. The first pinning antiferromagnetic layer 16 is located on the opposite side of the first pinned magnetic layer 15 from the first free magnetic layer 13 (on the Z1 side on the Z1-Z2 axis). An exchange coupling magnetic field Hex is generated (at the interface) between the first pinned magnetic layer 15 and the first pinning antiferromagnetic layer 16 in the first pinning exchange coupling film 511. The fixed magnetization direction P of the first pinned magnetic layer 15 associated with the exchange coupling magnetic field Hex is the X2 direction on the X1-X2 axis, as indicated by black arrows in FIGS. 2 and 3A and a backward arrow in the drawing of FIG. 4A.

The first magnetoresistive sensor M1 includes two first magnetic field application bias films MB11 and MB12 to apply a bias magnetic field to the first free magnetic layer 13. The first magnetic field application bias film MB11, the first magnetoresistive film MR1, and the first magnetic field application bias film MB12 are juxtaposed on the substrate SB in this order from the Y1 side to the Y2 side on the Y1-Y2 axis.

As illustrated in FIG. 4A, in each of the first magnetic field application bias films MB11 and MB12, a first ferromagnetic layer 83 and a first biasing antiferromagnetic layer 84 constitute a first biasing exchange coupling film 512 on an underlayer 81 on the substrate SB. An exchange coupling magnetic field Hex in the Y1 direction on the Y1-Y2 axis is generated (at the interface) between the first biasing antiferromagnetic layer 84 and the first ferromagnetic layer 83. A biasing exchange coupling magnetic field Hex11 in the first magnetic field application bias film MB11 and a biasing exchange coupling magnetic field Hex12 in the first magnetic field application bias film MB12 are indicated by hatched arrows in FIGS. 3A and 4A.

As indicated by white arrows in FIGS. 2, 3A, and 4A, due to these biasing exchange coupling magnetic fields Hex11 and Hex12, a bias magnetic field in the Y1 direction on the Y1-Y2 axis (in a bias application direction F) is applied to the first free magnetic layer 13 in the direction of the exchange coupling magnetic field Hex. In the absence of the external magnetic field H, the bias magnetic field magnetizes the first free magnetic layer 13 in the bias application direction F.

The second magnetoresistive sensor M2 includes a second magnetoresistive film MR2. The second magnetoresistive film MR2 is a giant magnetoresistive film including a second pinned magnetic layer 25 with fixed magnetization in the X1 direction on the X1-X2 axis (in the fixed magnetization direction P) and a second free magnetic layer 23 that is easily magnetized along the external magnetic field H applied.

The second pinned magnetic layer 25 and a second pinning antiferromagnetic layer 26 constitute a second pinning exchange coupling film 521. The second pinning antiferromagnetic layer 26 is located on the opposite side of the second pinned magnetic layer 25 from the second free magnetic layer 23 (on the Z1 side on the Z1-Z2 axis). An exchange coupling magnetic field Hex is generated (at the interface) between the second pinned magnetic layer 25 and the second pinning antiferromagnetic layer 26 in the second pinning exchange coupling film 521. The fixed magnetization direction P of the second pinned magnetic layer 25 associated with the exchange coupling magnetic field Hex is the X1 direction on the X1-X2 axis, as indicated by black arrows in FIGS. 2 and 3B and a forward arrow in the drawing of FIG. 4B. The fixed magnetization direction P of the first pinned magnetic layer 15 is coaxial with but opposite to, that is, antiparallel to the fixed magnetization direction P of the second pinned magnetic layer 25.

The second magnetoresistive sensor M2 includes two second magnetic field application bias films MB21 and MB22 to apply a bias magnetic field to the second free magnetic layer 23. The second magnetic field application bias film MB21, the second magnetoresistive film MR2, and the second magnetic field application bias film MB22 are juxtaposed on the substrate SB in this order from the Y1 side to the Y2 side on the Y1-Y2 axis.

As illustrated in FIG. 4B, in each of the second magnetic field application bias films MB21 and MB22, a second ferromagnetic layer 93 and a second biasing antiferromagnetic layer 94 constitute a second biasing exchange coupling film 522 on an underlayer 91 on the substrate SB. An exchange coupling magnetic field Hex in the Y1 direction on the Y1-Y2 axis is generated (at the interface) between the second biasing antiferromagnetic layer 94 and the second ferromagnetic layer 93. A biasing exchange coupling magnetic field Hex21 in the second magnetic field application bias film MB21 and a biasing exchange coupling magnetic field Hex22 in the second magnetic field application bias film MB22 are indicated by hatched arrows in FIGS. 3B and 4B.

As indicated by white arrows in FIGS. 3B and 4B, due to these biasing exchange coupling magnetic fields Hex21 and Hex22, a bias magnetic field in the Y1 direction on the Y1-Y2 axis (in the bias application direction F) is applied to the second free magnetic layer 23 in the direction of the exchange coupling magnetic field Hex. In the absence of the external magnetic field H, the bias magnetic field magnetizes the second free magnetic layer 23 in the bias application direction F. The direction of a bias magnetic field applied to the first free magnetic layer 13 (the bias application direction F) is coaxial with and the same as, that is, parallel to the direction of a bias magnetic field applied to the second free magnetic layer 23 (the bias application direction F).

Because the direction of the exchange coupling magnetic field Hex in the first pinning exchange coupling film 511 is nonparallel to (more specifically, when viewed along the Z1-Z2 axis (when viewed in the stacking direction), perpendicular to) the direction of the exchange coupling magnetic field Hex in the first biasing exchange coupling film 512, the fixed magnetization direction P of the first pinned magnetic layer 15 is perpendicular to the bias application direction F of the first free magnetic layer 13 when viewed along the Z1-Z2 axis. Because the direction of the exchange coupling magnetic field Hex in the second pinning exchange coupling film 521 is nonparallel to (more specifically, when viewed along the Z1-Z2 axis, perpendicular to) the direction of the exchange coupling magnetic field Hex in the second biasing exchange coupling film 522, the fixed magnetization direction P of the second pinned magnetic layer 25 is perpendicular to the bias application direction F of the second free magnetic layer 23 when viewed along the Z1-Z2 axis. Application of the external magnetic field H to the magnetic sensor 100 along the X1-X2 axis rotates the magnetization direction of the first free magnetic layer 13 and the magnetization direction of the second free magnetic layer 23 in the direction of the external magnetic field H, and the resistance of the first magnetoresistive sensor M1 and the resistance of the second magnetoresistive sensor M2 depend on the magnetization direction of the pinned magnetic layer and the magnetization direction of the free magnetic layer.

Because the fixed magnetization direction P of the first pinned magnetic layer 15 is antiparallel to the fixed magnetization direction P of the second pinned magnetic layer 25, the external magnetic field H in the X2 direction on the X1-X2 axis reduces the resistance of the first magnetoresistive sensor M1 and increases the resistance of the second magnetoresistive sensor M2. Thus, the differential output (OutX1)−(OutX2) is positive. In contrast, the external magnetic field H in the X1 direction on the X1-X2 axis increases the resistance of the first magnetoresistive sensor M1 and reduces the resistance of the second magnetoresistive sensor M2. Thus, the differential output (OutX1)−(OutX2) is negative. Thus, the direction of the external magnetic field H can be determined from the polarity of differential output (OutX1)−(OutX2).

As described above, in the magnetic sensor 100, the exchange coupling magnetic field Hex defines magnetization in the three directions: the fixed magnetization direction P in the first magnetoresistive sensor M1 (the X2 direction on the X1-X2 axis), the fixed magnetization direction P in the second magnetoresistive sensor M2 (the X1 direction on the X1-X2 axis), and the bias magnetic field direction in the first magnetoresistive sensor M1 and the second magnetoresistive sensor M2 (the bias application direction F, the Y1 direction on the Y1-Y2 axis). To achieve magnetization in the three directions, the magnetic sensor 100 includes three materials with different blocking temperatures Tbs as antiferromagnetic layers involved in the generation of the exchange coupling magnetic field Hex, as described below.

More specifically, each of the blocking temperature Tbf1 of the first pinning antiferromagnetic layer 16 and the blocking temperature Tbf2 of the second pinning antiferromagnetic layer 26 is higher than the blocking temperature Tb1 of a first biasing antiferromagnetic layer 12 and the blocking temperature Tb2 of a second biasing antiferromagnetic layer 22. The blocking temperature Tb1 of the first biasing antiferromagnetic layer 12 is higher than the blocking temperature Tb2 of the second biasing antiferromagnetic layer 22. Thus, different blocking temperatures Tbs can result in exchange coupling magnetic fields in the three different directions.

Table 1 shows a specific example of the first magnetoresistive film MR1. In Table 1, the leftmost column indicates each layer of the first magnetoresistive film MR1, and the second column from the right indicates an example of the material of each layer. The numerical values in the rightmost column indicate the thickness of each layer (unit: angstrom (Å)). The first magnetoresistive film MR1 is a giant magnetoresistive film, and a nonmagnetic material layer 14 between the first pinned magnetic layer 15 and the first free magnetic layer 13 constitutes a spin-valve structure.

TABLE 1

| 17 | Protective layer | Ta | 90 |
|---|---|---|---|
| 16 | First pinning antiferromagnetic layer | 51PtCr | 280 |
|  |  | 50PtMn | 20 |

TABLE 1-continued

| 15 | First pinned magnetic layer | Ferromagnetic layer | 60FeCo | 17 |
|---|---|---|---|---|
| | | Nonmagnetic intermediate layer | Ru | 3.6 |
| | | Ferromagnetic layer | 90CoFe | 24 |
| 14 | | Nonmagnetic material layer | Cu | 30 |
| 13 | First free magnetic layer | Ferromagnetic layer | 90CoFe | 14 |
| | | Ferromagnetic layer | 81.5NiFe | 18 |
| 11 | | Underlayer | NiFeCr | 42 |

An underlayer 11 on the substrate SB may be formed of a NiFeCr alloy (a nickel-iron-chromium alloy), Cr, or Ta. In Table 1, the underlayer 11 is a NiFeCr alloy layer 42 angstroms in thickness.

The first free magnetic layer 13 is located on the underlayer 11. The first free magnetic layer 13 may be formed of a CoFe alloy (a cobalt-iron alloy) or a NiFe alloy (a nickel-iron alloy) and may have a monolayer structure, a layered structure, or a layered ferri structure. In Table 1, a $Ni_{81.5\ at\ \%}Fe_{18.5\ at\ \%}$ layer 18 angstroms in thickness and a $Co_{90\ at\ \%}Fe_{10\ at\ \%}$ layer 14 angstroms in thickness are located on the first biasing antiferromagnetic layer 12 in this order to constitute the first free magnetic layer 13.

The nonmagnetic material layer 14 is located on the first free magnetic layer 13. The nonmagnetic material layer 14 can be formed of Cu (copper) or the like. In Table 1, the nonmagnetic material layer 14 is a Cu layer 30 angstroms in thickness.

The first pinned magnetic layer 15 is located on the nonmagnetic material layer 14. The first pinned magnetic layer 15 is formed of a ferromagnetic CoFe alloy (a cobalt-iron alloy). The coercive force of the CoFe alloy increases with the Fe content. The first pinned magnetic layer 15 contributes to the spin-valve giant magnetoresistance effect. The fixed magnetization direction P of the first pinned magnetic layer 15 is the sensitivity axis direction of the first magnetoresistive sensor M1. To increase the resistance of the first pinning exchange coupling film 511 to a strong magnetic field, the first pinned magnetic layer 15 preferably has a self-pinning structure, as shown in Table 1. In Table 1, a $Co_{90\ at\ \%}Fe_{10\ at\ \%}$ ferromagnetic layer 24 angstroms in thickness, a Ru nonmagnetic intermediate layer 3.6 angstroms in thickness, and a $Fe_{60\ at\ \%}Co_{40\ at\ \%}$ ferromagnetic layer 17 angstroms in thickness are located on the nonmagnetic material layer 14 in this order.

The first pinning antiferromagnetic layer 16 is located on the $Fe_{60\ at\ \%}Co_{40\ at\ \%}$ ferromagnetic layer 17 angstroms in thickness constituting the first pinned magnetic layer 15. A $Pt_{50\ at\ \%}Mn_{50\ at\ \%}$ layer 20 angstroms in thickness and a $Pt_{51\ at\ \%}Cr_{49\ at\ \%}$ layer 280 angstroms in thickness are layered on the first pinned magnetic layer 15 in this order to form the first pinning antiferromagnetic layer 16.

The first pinning antiferromagnetic layer 16 is annealed for ordering and forms, together with the first pinned magnetic layer 15, the first pinning exchange coupling film 511. An exchange coupling magnetic field Hex is generated (at the interface) between the first pinning antiferromagnetic layer 16 and the first pinned magnetic layer 15. The first pinning antiferromagnetic layer 16 has a blocking temperature Tbf1 of approximately 500° C. Thus, the exchange coupling magnetic field Hex is maintained even when the first pinning exchange coupling film 511 is heated to approximately 400° C. In the formation of an alloy layer, such as the first pinning antiferromagnetic layer 16, metals for forming the alloy (Pt and Mn and Pt and Cr for the first pinning antiferromagnetic layer 16) may be simultaneously or alternately supplied. For example, metals for forming the alloy may be simultaneously sputtered, or different types of metal films may be alternately stacked. Simultaneous supply of metals for forming the alloy is sometimes preferred rather than alternate supply to increase the exchange coupling magnetic field Hex.

A protective layer 17 is formed on the first pinning antiferromagnetic layer 16. The protective layer 17 can be formed of Ta (tantalum) or the like. In Table 1, a Ta layer 90 angstroms in thickness is formed.

Table 2 shows specific examples of the first magnetic field application bias films MB11 and MB12. In Table 2, the leftmost column indicates each layer of the first magnetic field application bias films MB11 and MB12, and the second column from the right indicates an example of the material of each layer. The numerical values in the rightmost column indicate the thickness of each layer (unit: angstrom (Å)).

TABLE 2

| 85 | Protective layer | Ta | 100 |
|---|---|---|---|
| 84 | First biasing antiferromagnetic layer | 50PtMn | 300 |
| 83 | First ferromagnetic layer | 90CoFe | 100 |
| 82 | Nonmagnetic material layer | Ru | 10 |
| | | Cu | 40 |
| 81 | Underlayer | NiFeCr | 42 |

The underlayer 81 is a NiFeCr alloy layer 42 angstroms in thickness. A nonmagnetic material layer 82 is located on the underlayer 81. The nonmagnetic material layer 82 includes a Cu layer 40 angstroms in thickness and a Ru layer 10 angstroms in thickness. The first ferromagnetic layer 83 with a thickness of 100 angstroms composed of $Co_{90\ at\ \%}Fe_{10\ at\ \%}$ is located on the nonmagnetic material layer 82. The first biasing antiferromagnetic layer 84 with a thickness of 300 angstroms composed of $Pt_{50\ at\ \%}Mn_{50\ at\ \%}$ is located on the first ferromagnetic layer 83. The first biasing antiferromagnetic layer 12 is annealed to order the first biasing antiferromagnetic layer 84 and forms, together with the first ferromagnetic layer 83, the first biasing exchange coupling film 512 by exchange coupling. Biasing exchange coupling magnetic fields Hex11 and Hex12 are generated (at the interface) between the first biasing antiferromagnetic layer 84 and the first ferromagnetic layer 83. The first biasing antiferromagnetic layer 84 has a blocking temperature Tb1 of approximately 400° C. Thus, the exchange coupling magnetic field Hex is maintained even when the first biasing exchange coupling film 512 is heated to approximately 300° C.

A Ta protective layer 85 with a thickness of 100 angstroms is located on the first biasing antiferromagnetic layer 84.

Table 3 shows a specific example of the second magnetoresistive film MR2. In Table 3, the leftmost column indicates each layer of the second magnetoresistive film MR2, and the second column from the right indicates an example of the material of each layer. The numerical values in the rightmost column indicate the thickness of each layer (unit: angstrom (Å)). The second magnetoresistive film MR2 is a giant magnetoresistive film, and a nonmagnetic material layer 24 between the second pinned magnetic layer 25 and the second free magnetic layer 23 constitutes a spin-valve structure.

TABLE 3

| 27 | Protective layer | Ta | 90 |
|---|---|---|---|
| 26 | Second pinning antiferromagnetic layer | 51 PtCr | 280 |
| | | 50PtMn | 20 |

TABLE 3-continued

| 25 | Second pinned magnetic layer | Ferromagnetic layer | 60FeCo | 17 |
|---|---|---|---|---|
|  |  | Nonmagnetic intermediate layer | Ru | 3.6 |
|  |  | Ferromagnetic layer | 90CoFe | 24 |
| 24 |  | Nonmagnetic material layer | Cu | 30 |
| 23 | Second free magnetic layer | Ferromagnetic layer | 90CoFe | 14 |
|  |  | Ferromagnetic layer | 81.5NiFe | 18 |
| 21 |  | Underlayer | NiFeCr | 42 |

An underlayer 21, the second free magnetic layer 23, the nonmagnetic material layer 24, the second pinned magnetic layer 25, and a protective layer 27 have the same compositions as the underlayer 11, the first free magnetic layer 13, the nonmagnetic material layer 14, the first pinned magnetic layer 15, and the protective layer 17, respectively, and are not described here.

A $Pt_{50\ at\ \%}Mn_{50\ at\ \%}$ layer 20 angstroms in thickness and a $Pt_{51\ at\ \%}Cr_{49\ at\ \%}$ layer 280 angstroms in thickness are layered on the second pinned magnetic layer 25 in this order to form the second pinning antiferromagnetic layer 26. The second pinning antiferromagnetic layer 26 is annealed for ordering and forms, together with the second pinned magnetic layer 25, the second pinning exchange coupling film 521 by exchange coupling. An exchange coupling magnetic field Hex is generated (at the interface) between the second pinning antiferromagnetic layer 26 and the second pinned magnetic layer 25. The second pinning antiferromagnetic layer 26 has a blocking temperature Tbf2 of approximately 500° C. Thus, the exchange coupling magnetic field Hex is maintained even when the second pinning exchange coupling film 521 is heated to approximately 400° C.

Table 4 shows specific examples of the second magnetic field application bias films MB21 and MB22. In Table 4, the leftmost column indicates each layer of the second magnetic field application bias films MB21 and MB22, and the second column from the right indicates an example of the material of each layer. The numerical values in the rightmost column indicate the thickness of each layer (unit: angstrom (Å)).

TABLE 4

| 95 | Protective layer | Ta | 100 |
|---|---|---|---|
| 94 | Second biasing antiferromagnetic layer | 20IrMn | 80 |
| 93 | Second ferromagnetic layer | 90CoFe | 100 |
| 92 | Nonmagnetic material layer | Ru | 10 |
|  |  | Cu | 40 |
| 91 | Underlayer | NiFeCr | 42 |

The underlayer 91, a nonmagnetic material layer 92, the second ferromagnetic layer 93, and a protective layer 95 have the same composition as the underlayer 81, the nonmagnetic material layer 82, the first ferromagnetic layer 83, and the protective layer 85, respectively, and are not described here.

The second biasing antiferromagnetic layer 94 is an $Ir_{20\ at\ \%}Mn_{80\ at\ \%}$ layer 80 angstroms in thickness. The second biasing antiferromagnetic layer 94 and the second ferromagnetic layer 93 form the second biasing exchange coupling film 522 by exchange coupling and generate the biasing exchange coupling magnetic fields Hex21 and Hex22 (at the interface) between the second biasing antiferromagnetic layer 94 and the second ferromagnetic layer 93. The second biasing antiferromagnetic layer 94 has a blocking temperature Tb2 of approximately 300° C., which is lower than the blocking temperature Tb1 of the first biasing antiferromagnetic layer 84 (approximately 400° C.)

Thus, the magnetic sensor 100 includes the three antiferromagnetic layers with different blocking temperatures Tbs.

In the magnetic sensor 100 produced by forming and heating each layer as described below, therefore, each magnetoresistive sensor (the first magnetoresistive sensor M1, the second magnetoresistive sensor M2) can have a fixed magnetization direction P and a bias application direction F in predetermined directions.

First, the layers of the first magnetoresistive film MR1 and the layers of the second magnetoresistive film MR2 are stacked and subjected to the fixed magnetization axis setting step. In this step, the first pinning antiferromagnetic layer 16 and the second pinning antiferromagnetic layer 26 are ordered by heat treatment.

Any ordering temperature may be used. The ordering temperature is typically slightly lower than the blocking temperature Tbf1 of the first pinning antiferromagnetic layer 16 and the blocking temperature Tbf2 of the second pinning antiferromagnetic layer 26, for example, approximately 300° C. to 400° C. The heat-treatment time may also be any time, provided that the ordering can be achieved. For example, the heat-treatment time may be, but is limited to, one hour or more, more specifically approximately five hours.

Thus, the first pinning antiferromagnetic layer 16 and the second pinning antiferromagnetic layer 26 are ordered, and an exchange coupling magnetic field Hex is generated in the first pinning exchange coupling film 511 and the second pinning exchange coupling film 521. In the ordering, the magnetization direction of the first pinning antiferromagnetic layer 16 is adjusted to the magnetization direction of the first pinned magnetic layer 15. Thus, the exchange coupling magnetic field Hex in the first pinning exchange coupling film 511 is generated in the magnetization direction of the first pinned magnetic layer 15. In the ordering, the magnetization direction of the second pinning antiferromagnetic layer 26 is adjusted to the magnetization direction of the second pinned magnetic layer 25. Thus, the exchange coupling magnetic field Hex in the second pinning exchange coupling film 521 is generated in the magnetization direction of the second pinned magnetic layer 25.

Thus, setting the magnetization direction of the first pinned magnetic layer 15 in the X2 direction on the X1-X2 axis during the formation of the first pinned magnetic layer 15 and setting the magnetization direction of the second pinned magnetic layer 25 in the X1 direction on the X1-X2 axis during the formation of the second pinned magnetic layer 25 can make the fixed magnetization direction P of the first pinned magnetic layer 15 coaxial with (more specifically, antiparallel to) the fixed magnetization direction P of the second pinned magnetic layer 25 in the fixed magnetization axis setting step.

After the fixed magnetization axes of the first magnetoresistive film MR1 and the second magnetoresistive film MR2 are set as described above, the layers of the two first magnetic field application bias films MB11 and MB12 are juxtaposed to the first magnetoresistive film MR1, and the layers of the two second magnetic field application bias films MB21 and MB22 are juxtaposed to the second magnetoresistive film MR2.

Subsequently, in the first bias magnetic field setting step, heat treatment is performed at a temperature lower than the blocking temperature Tbf1 of the first pinning antiferromagnetic layer 16 and the blocking temperature Tbf2 of the second pinning antiferromagnetic layer 26 (for example, 350° C.). In the heat treatment, application of an external magnetic field in the Y1 direction on the Y1-Y2 axis generates the biasing exchange coupling magnetic fields Hex11 and Hex12 in the external magnetic field direction between the first biasing antiferromagnetic layer 84 and the first ferromagnetic layer 83 in the first magnetic field application bias films MB11 and MB12. Due to these biasing exchange coupling magnetic fields Hex11 and Hex12, a bias magnetic field is applied to the first free magnetic layer 13 in the Y1 direction on the Y1-Y2 axis (in the bias application direction F). The bias application direction F of the first free magnetic layer 13 is nonparallel to, more specifically when viewed along the Z1-Z2 axis perpendicular to, the fixed magnetization direction P of the first pinned magnetic layer 15.

The heat-treatment temperature in the first bias magnetic field setting step is lower than the blocking temperature Tbf1 of the first pinning antiferromagnetic layer 16 and the blocking temperature Tbf2 of the second pinning antiferromagnetic layer 26. Thus, the fixed magnetization direction P in the first pinned magnetic layer 15 and the fixed magnetization direction P in the second pinned magnetic layer 25 are not changed to the direction of the applied external magnetic field and are maintained.

Finally, in the second bias magnetic field setting step, heat treatment is performed at a temperature lower than the blocking temperature Tb1 of the first biasing antiferromagnetic layer 12 (for example, 300° C.). In the heat treatment, application of an external magnetic field in the Y1 direction on the Y1-Y2 axis generates the biasing exchange coupling magnetic fields Hex21 and Hex22 in the magnetic field direction between the second biasing antiferromagnetic layer 94 and the second ferromagnetic layer 93 in the second magnetic field application bias films MB21 and MB22. Due to these biasing exchange coupling magnetic fields Hex21 and Hex22, a bias magnetic field is applied to the second free magnetic layer 23 in the Y1 direction on the Y1-Y2 axis (in the bias application direction F). The bias application direction F of the second free magnetic layer 23 is nonparallel to, more specifically when viewed along the Z1-Z2 axis perpendicular to, the fixed magnetization direction P of the second pinned magnetic layer 25.

The heat-treatment temperature in the second bias magnetic field setting step is lower than the blocking temperature Tbf1 of the first pinning antiferromagnetic layer 16, the blocking temperature Tbf2 of the second pinning antiferromagnetic layer 26, and the blocking temperature Tb1 of the first biasing antiferromagnetic layer 12. Thus, the fixed magnetization direction P in the first pinned magnetic layer 15, the fixed magnetization direction P in the second pinned magnetic layer 25, and the direction of a bias magnetic field applied to the first free magnetic layer 13 (the bias application direction F) are not changed to the direction of the magnetic field applied and are maintained.

Thus, when the magnetic sensor 100 includes the three antiferromagnetic layers with different blocking temperatures Tbs, the above step can generate an exchange coupling magnetic field Hex in any direction in the ferromagnetic layers exchange-coupled with the antiferromagnetic layers (the first pinned magnetic layer 15, the second pinned magnetic layer 25, the first free magnetic layer 13, and the second free magnetic layer 23).

A multilayer antiferromagnetic layer for use in the first pinning antiferromagnetic layer 16 of the first pinning exchange coupling film 511 and the second pinning antiferromagnetic layer 26 of the second pinning exchange coupling film 521 is described in detail below.

A multilayer antiferromagnetic layer according to an embodiment of the present invention includes an X(Cr—Mn) layer containing one or two or more elements X selected from the group consisting of platinum group elements and Ni and containing Mn and Cr. Each of the first pinning antiferromagnetic layer 16 and the second pinning antiferromagnetic layer 26 is a Pt(Cr—Mn) layer because the element X is Pt. The Pt(Cr—Mn) layer has a first region located relatively near the ferromagnetic layers (the first pinned magnetic layer 15, the second pinned magnetic layer 25) exchange-coupled with the antiferromagnetic layers (the first pinning antiferromagnetic layer 16, the second pinning antiferromagnetic layer 26) and a second region located relatively far from the ferromagnetic layers (the first pinned magnetic layer 15, the second pinned magnetic layer 25). The first region has a higher Mn content than the second region. The Pt(Cr—Mn) layer with such a structure is formed by annealing a PtMn layer and a PtCr layer stacked. The content distribution of the constituent elements in the depth direction (depth profile) can be determined by surface analysis during sputtering.

Figure 5A:
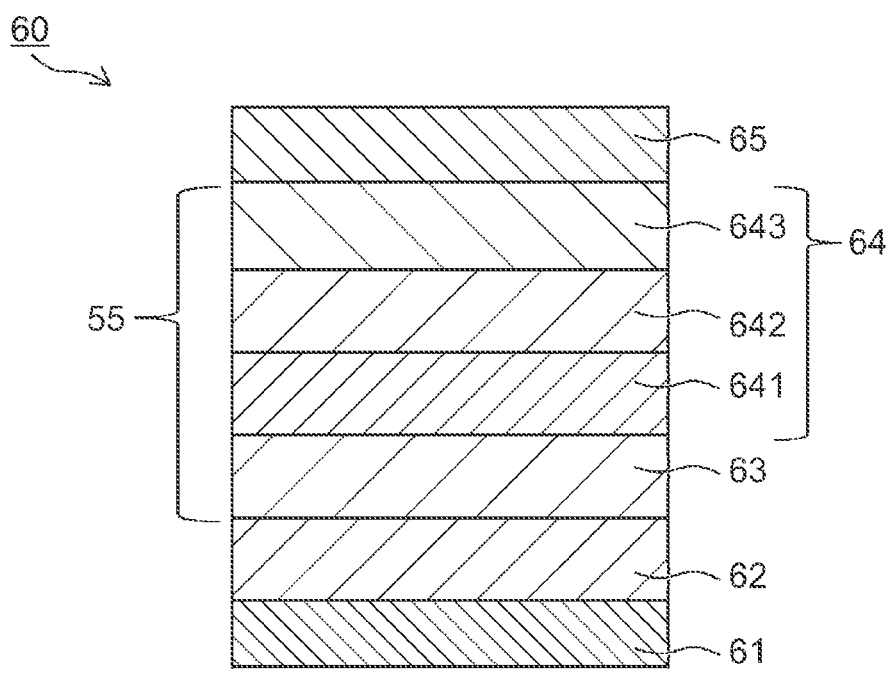
FIG. 5A is an explanatory view of a film that includes an exchange coupling film including an antiferromagnetic layer like a multilayer antiferromagnetic layer according to an embodiment of the present invention.
Figure 5B:
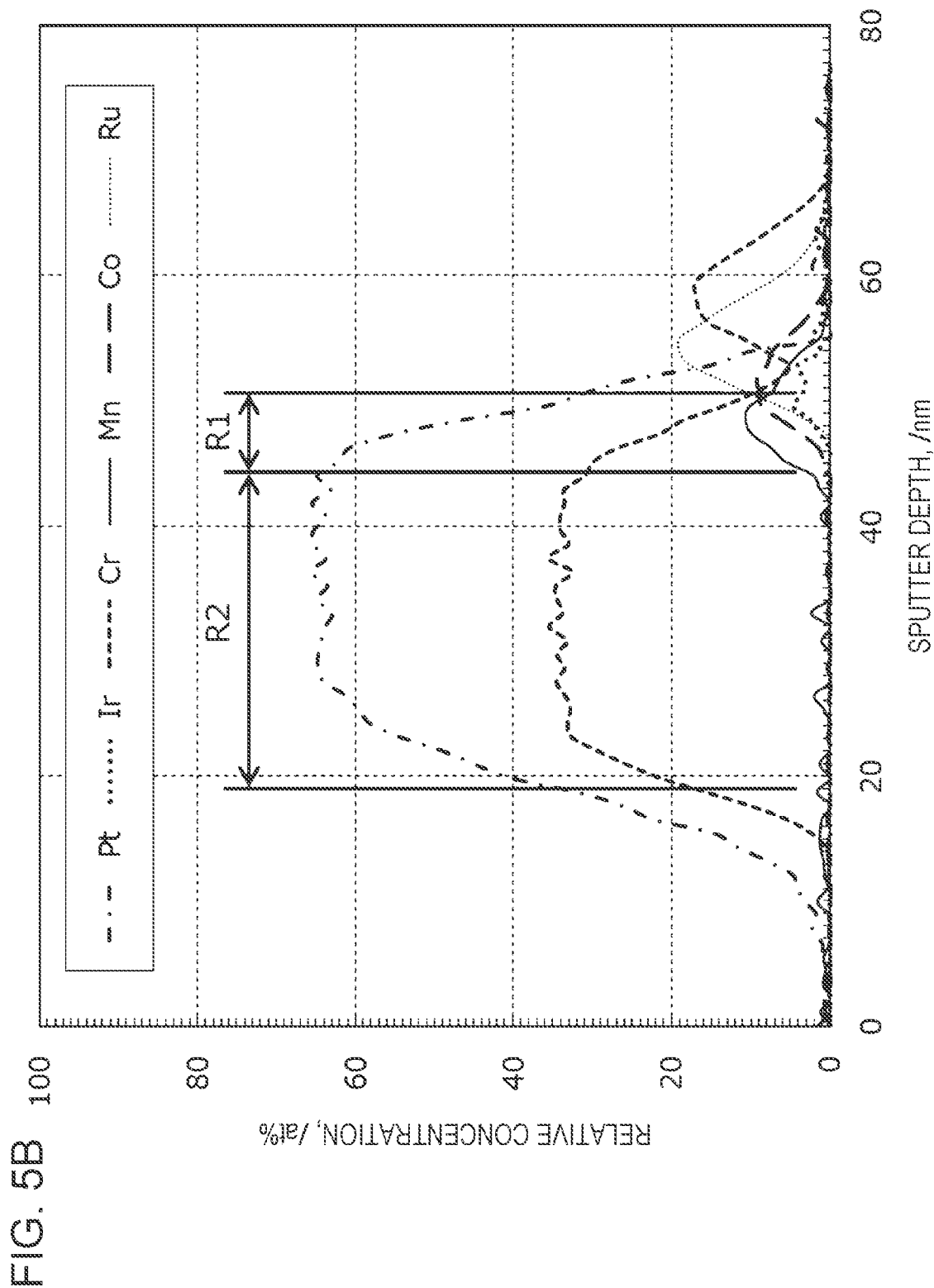
FIG. 5B is a depth profile of FIG. 4A.

FIG. 5A is an explanatory view of a film 60 that includes an exchange coupling film 55 including an antiferromagnetic layer 64 like a multilayer antiferromagnetic layer according to an embodiment of the present invention. FIG. 5B is a depth profile of the film 60. As illustrated in FIG. 5A, the film 60 has the following layered structure. Each numerical value in parentheses indicates the thickness (angstroms). An IrMn layer 641, a PtMn layer 642, and a PtCr layer 643 are layered on the pinned magnetic layer 63 in this order to form the antiferromagnetic layer 64.

Substrate/underlayer 61: NiFeCr (40)/nonmagnetic material layer 62: [Cu (40)/Ru (20)]/pinned magnetic layer 63: $Co_{40\ at\ \%}Fe_{60\ at\ \%}$ (20)/antiferromagnetic layer 64 [IrMn layer 641: $Ir_{22\ at\ \%}Mn_{78\ at\ \%}$ (10)/PtMn layer 642: $Pt_{50\ at\ \%}Mn_{50\ at\ \%}$ (16)/PtCr layer 643: $Pt_{51\ at\ \%}Cr_{49\ at\ \%}$ (300)]/protective layer 65: Ta (100)

The depth profile in FIG. 5B was measured in the film 60 with the above structure ordered by annealing in a 15-kOe magnetic field at 350° C. for 20 hours.

More specifically, the depth profile in FIG. 5B is the distribution of the Pt, Ir, Cr, and Mn contents in the depth direction obtained by a surface analysis with an Auger electron spectrometer during argon sputtering on the protective layer 65. The argon sputtering rate was 1.1 nm/min on a $SiO_2$ basis.

Figure 6:
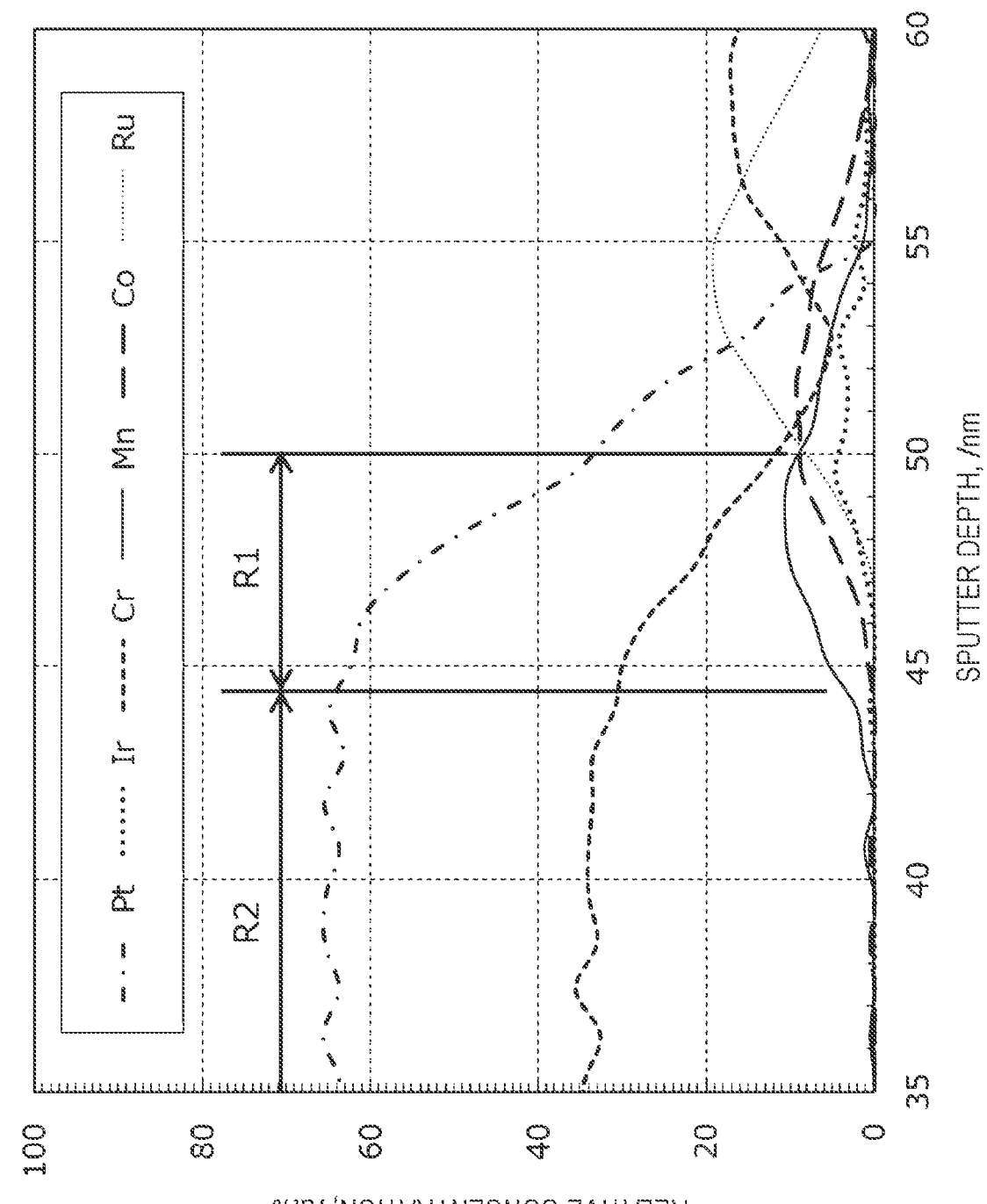
FIG. 6 is an enlarged profile of a portion of the depth profile of FIG. 5B.

FIG. 6 is an enlarged view of FIG. 5B. In both FIG. 5B and FIG. 6, to determine the depth positions of the pinned magnetic layer 63 and the nonmagnetic material layer 62, the depth profile also includes the distribution of the Co content (one of the constituent elements of the pinned magnetic layer 63) and the distribution of the Ru content (an element constituting the antiferromagnetic layer 64 side of the nonmagnetic material layer 62).

FIG. 5B shows that the antiferromagnetic layer 64 has a thickness of approximately 30 nm and includes an X(Cr—Mn) layer containing Pt and Ir as one or two or more elements X selected from the group consisting of platinum group elements and Ni and containing Mn and Cr, more specifically a (Pt—Ir) (Cr—Mn) layer. The X(Cr—Mn) layer (the (Pt—Ir) (Cr—Mn) layer) has a first region R1 located relatively near the pinned magnetic layer 63 and a second region R2 located relatively far from the pinned magnetic layer 63. The first region R1 has a higher Mn content than the second region R2. Such a structure can be formed by stacking an XCr layer and an XMn layer to form a layered body and annealing the layered body as described above.

Figure 7:
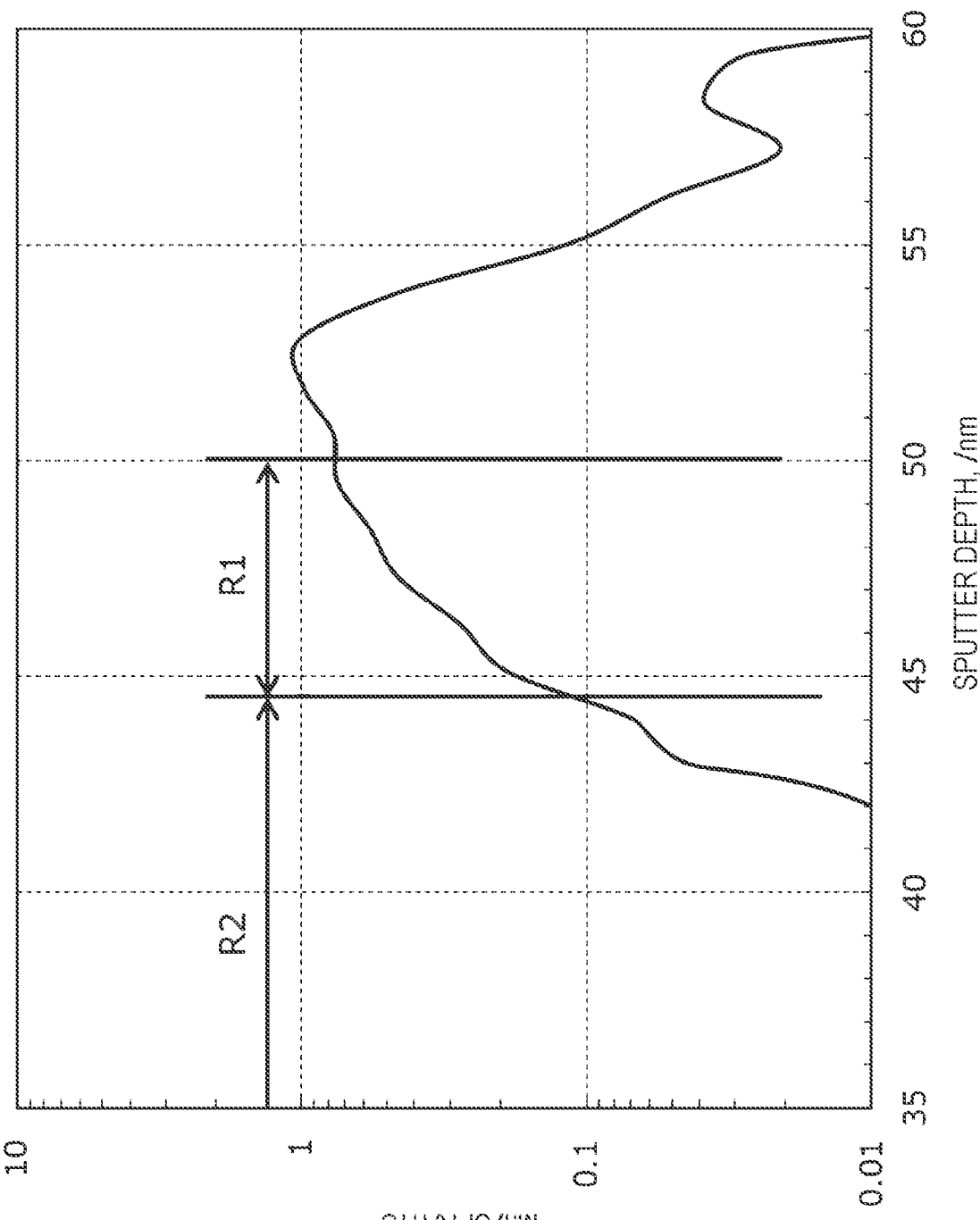
FIG. 7 is a graph of the ratio of the Mn content to the Cr content (Mn/Cr ratio) based on FIG. 6, and the range in the horizontal axis is the same as in FIG. 6.

FIG. 7 is a graph of the ratio of the Mn content to the Cr content (Mn/Cr ratio) calculated from the Mn content and the Cr content at each depth in the depth profile. The range in the horizontal axis is the same as in FIG. 6. On the basis of FIG. 7, in the present specification, the depth at which the Mn/Cr ratio is 0.1 is the boundary between the first region R1 and the second region R2. More specifically, in the antiferromagnetic layer 64, a region located near the pinned magnetic layer 63 and having a Mn/Cr ratio of 0.1 or more is defined as the first region R1, and a region other than the first region in the antiferromagnetic layer 64 is defined as the second region R2. On the basis of this definition, the boundary between the first region R1 and the second region R2 is located at a depth of approximately 44.5 nm in the depth profile of FIG. 5B.

Not only a high Mn/Cr ratio has an influence on the intensity of the exchange coupling magnetic field Hex, but also a higher Mn/Cr ratio tends to result in a higher positive Hex/Hc value (Hc: coercive force). More specifically, the first region R1 preferably includes a portion with a Mn/Cr ratio of 0.3 or more, more preferably 0.7 or more, particularly preferably 1 or more.

Due to such a relatively high Mn content of the first region R1, the exchange coupling film 55 can generate a high exchange coupling magnetic field Hex. On the other hand, due to a low Mn content and a correspondingly high Cr content of the second region R2, the antiferromagnetic layer 64 has a high blocking temperature Tb. Thus, the exchange coupling film 55 can maintain the exchange coupling magnetic field Hex even in a high-temperature environment. Although the PtMn layer 642 and the IrMn layer 641 are stacked on the pinned magnetic layer 63 of the PtCr layer 643 in this embodiment, the present invention is not limited to the embodiment. An $X^0$Mn layer located nearer the ferromagnetic layer than the PtCr layer 643 (wherein $X^0$ denotes one or two or more elements selected from the group consisting of platinum group elements and Ni) may be located on the pinned magnetic layer 63. In the first pinning exchange coupling film 511, the $X^0$Mn layer is a PtMn layer (50PtMn in Table 1).

Figure 8A:
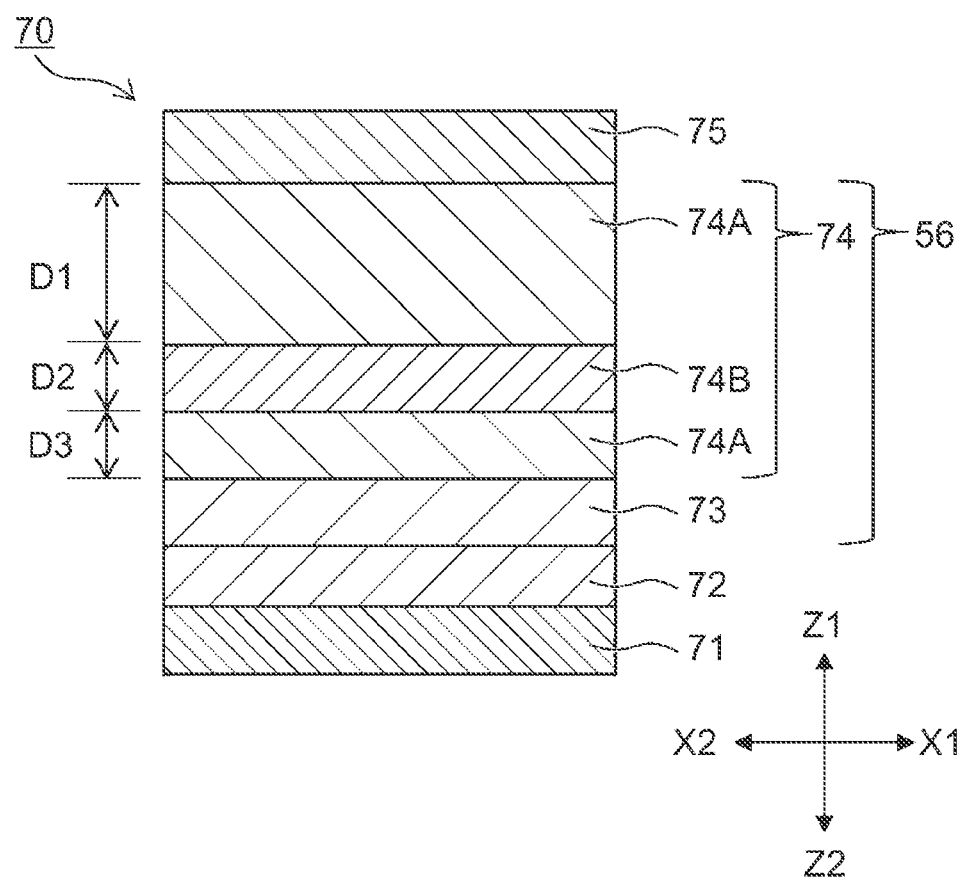
FIG. 8A is an explanatory view of a magnetoresistive film of a first magnetoresistive sensor according to a modified example of the first embodiment of the present invention.

FIG. 8A is an explanatory view of a multilayer antiferromagnetic layer according to another embodiment. The multilayer antiferromagnetic layer according to the present embodiment is different in the structure of layers stacked to form the antiferromagnetic layer from the antiferromagnetic layers according to the above embodiments of the present invention (the first pinning antiferromagnetic layer 16, the second pinning antiferromagnetic layer 26, and the antiferromagnetic layer 64). As illustrated in FIG. 8A, an antiferromagnetic layer 74 in an exchange coupling film 56 of a film 70 has an alternately layered structure composed of three layers consisting of $X^1$Cr layers 74A and an $X^2$Mn layer 74B (wherein $X^1$ and $X^2$ independently denote one or two or more elements selected from the group consisting of platinum group elements and $Ni_{81.5}$, and $X^1$ and $X^2$ may be the same or different). These layers are formed by sputtering or CVD, for example.

After its formation, the antiferromagnetic layer 74 is annealed for ordering and is exchange-coupled with a pinned magnetic layer 73 located on a nonmagnetic material layer 72 located on an underlayer 71, thereby generating an exchange coupling magnetic field Hex in the pinned magnetic layer 73.

In FIG. 8A, the antiferromagnetic layer 74 includes three-layer structure of the $X^1$Cr layer 74A/$X^2$Mn layer 74B/$X^1$Cr layer 74A in contact with the pinned magnetic layer 73 as one embodiment of an alternately layered structure of three layers or more composed of the $X^1$Cr layer 74A and the $X^2$Mn layer 74B. The $X^1$Cr layer 74A and the $X^2$Mn layer 74B may be replaced with each other, and the three-layer structure may be the $X^2$Mn layer 74B/$X^1$Cr layer 74A/$X^2$Mn layer 74B. In this three-layer structure, the $X^2$Mn layer 74B is in contact with the pinned magnetic layer 73. The antiferromagnetic layer 74 composed of four or more layers are described later.

In the case where the $X^1$Cr layer 74A is located nearest the pinned magnetic layer 73, the thickness D1 of the $X^1$Cr layer 74A in contact with a protective layer 75 is preferably larger than the thickness D3 of the $X^1$Cr layer 74A in contact with the pinned magnetic layer 73 in order to increase the exchange coupling magnetic field Hex. The thickness D1 of the $X^1$Cr layer 74A in the antiferromagnetic layer 74 is also preferably larger than the thickness D2 of the $X^2$Mn layer 74B. The ratio of the thickness D1 to the thickness D2 (D1:D2) preferably ranges from 5:1 to 100:1, more preferably 10:1 to 50:1. The ratio of the thickness D1 to the thickness D3 (D1:D3) preferably ranges from 5:1 to 100:1, more preferably 10:1 to 50:1.

In the case of the three-layer structure of the $X^2$Mn layer 74B/$X^1$Cr layer 74A/$X^2$Mn layer 74B where the $X^2$Mn layer 74B is located nearest the pinned magnetic layer 73, the thickness D3 of the $X^2$Mn layer 74B located nearest the pinned magnetic layer 73 may be the same as the thickness D1 of the $X^2$Mn layer 74B in contact with the protective layer 75.

To increase the exchange coupling magnetic field Hex, $X^1$ in the $X^1$Cr layer 74A is preferably Pt, and $X^2$ in the $X^2$Mn layer 74B is preferably Pt or Ir, more preferably Pt. In the case where the $X^1$Cr layer 74A is a PtCr layer, $Pt_xCr_{100-x}$ (wherein X denotes 45 to 62 atomic percent) is preferred, and $Pt_xCr_{100-x}$ (wherein X denotes 50 to 57 atomic percent) is more preferred. From the same perspective, the $X^2$Mn layer 74B is preferably a PtMn layer.

Figure 8B:
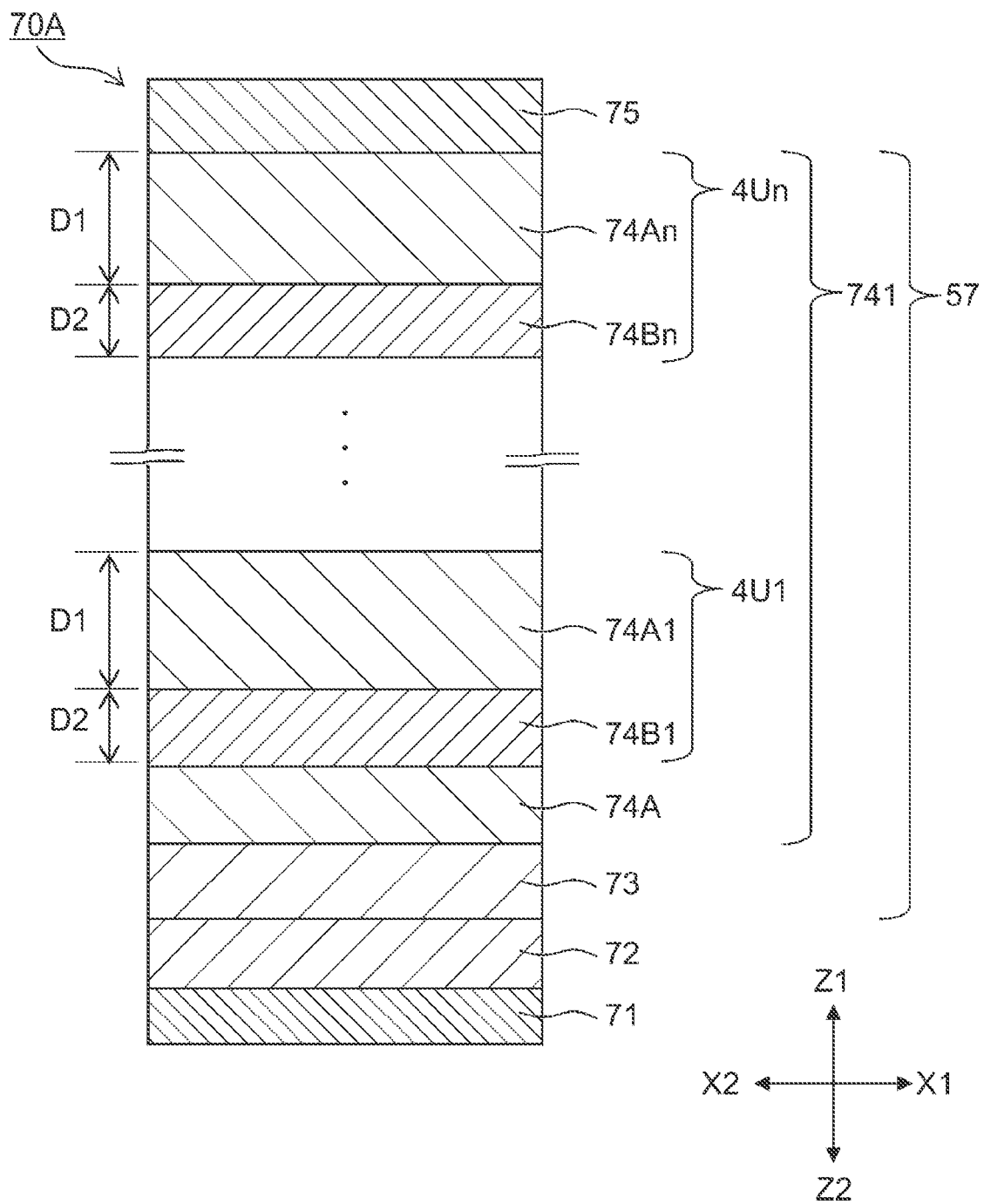
FIG. 8B is an explanatory view of a magnetoresistive film of a first magnetoresistive sensor according to another modified example of the first embodiment of the present invention.

FIG. 8B is an explanatory view of a multilayer antiferromagnetic layer according to a modified example of another embodiment. In the present embodiment, layers with the same function as in the film 70 illustrated in FIG. 8A are denoted by the same reference numerals and letters and are not described here. In a film 70A in FIG. 8B, the pinned magnetic layer 73 and an antiferromagnetic layer 741 constitute an exchange coupling film 57.

Unlike the exchange coupling film 56 in FIG. 8A, the exchange coupling film 57 in FIG. 8B includes four or more layers in the antiferromagnetic layer 741 and has a unit layered portion including a plurality of units each composed of the $X^1$Cr layer 74A and the $X^2$Mn layer 74B. In FIG. 8B, the exchange coupling film 57 includes unit layered portions 4U1 to 4Un (n is an integer of 2 or more). The unit layered portion 4U1 is composed of an $X^1$Cr layer 74A1 and an $X^2$Mn layer 74B1, and the unit layered portion 4Un is composed of an $X^1$Cr layer 74An and an $X^2$Mn layer 74Bn.

In the unit layered portions 4U1 to 4Un, the $X^1$Cr layers 74A1 to 74An have the same thickness D1, and the $X^2$Mn layers 74B1 to 74Bn have the same thickness D2. A high exchange coupling magnetic field Hex in the pinned magnetic layer 73 of the exchange coupling film 57 and better high-temperature stability of the antiferromagnetic layer 741 can be achieved by stacking the unit layered portions 4U1 to 4Un each having the same structure and annealing the layered body.

Although the antiferromagnetic layer 741 in FIG. 8B is composed of the unit layered portions 4U1 to 4Un and the $X^1$Cr layer 74A in contact with the pinned magnetic layer 73, the antiferromagnetic layer 741 may be composed only of the unit layered portions 4U1 to 4Un. In the antiferromagnetic layer 741 formed of a layered body composed only of the unit layered portions 4U1 to 4Un, the X²Mn layer 74B1 is in contact with the pinned magnetic layer 73.

The number of layers in the unit layered portions 4U1 to 4Un can be determined according to the size of the antiferromagnetic layer 741 and the thicknesses D1 and D2. For example, for a thickness D1 in the range of 5 to 15 angstroms and a thickness D2 in the range of 30 to 40 angstroms, the number of layers preferably ranges from 3 to 15, more preferably 5 to 12, in order to increase the exchange coupling magnetic field Hex in a high-temperature environment.

Figure 10A:
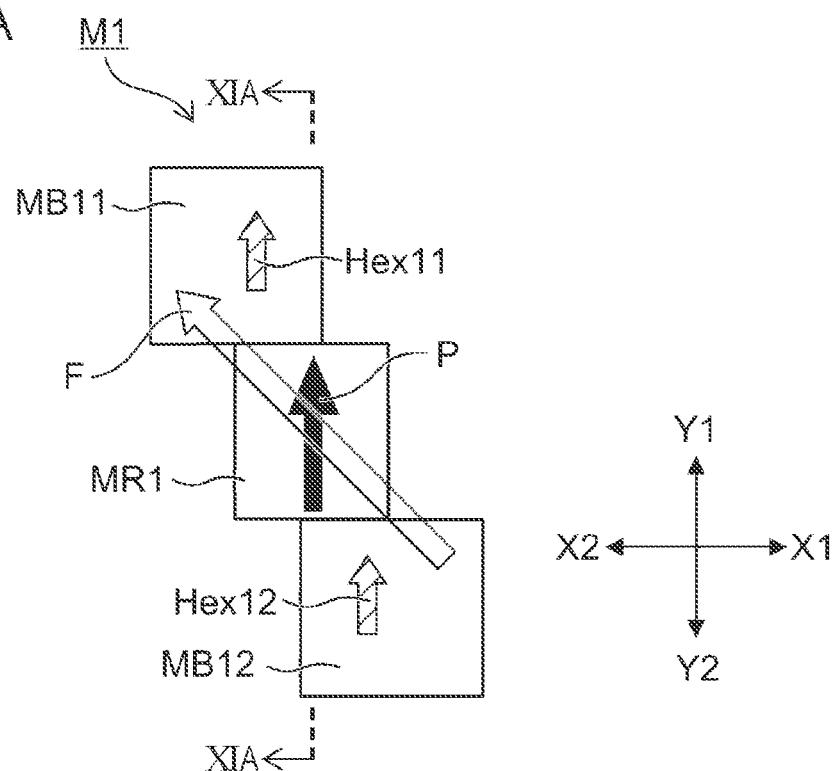
FIG. 10A is an explanatory view of a first magnetoresistive sensor according to the second embodiment of the present invention viewed along the Z1-Z2 axis.
Figure 10B:
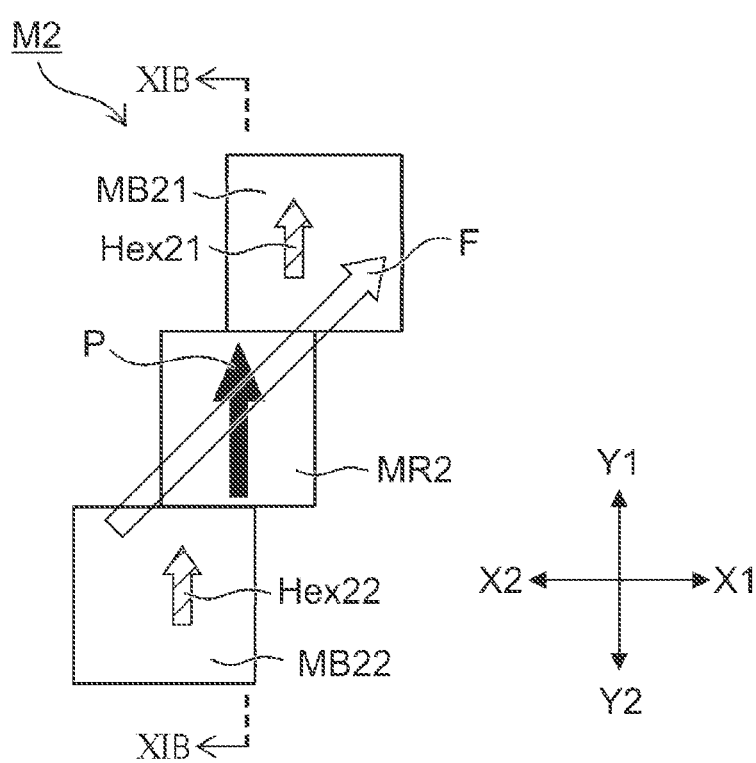
FIG. 10B is an explanatory view of a second magnetoresistive sensor according to the second embodiment of the present invention viewed along the Z1-Z2 axis.

FIG. 9 is a circuit block diagram of a magnetic sensor (magnetic detector) according to a second embodiment of the present invention. FIG. 10A is an explanatory view of a first magnetoresistive sensor according to the second embodiment of the present invention viewed along the Z1-Z2 axis. FIG. 10B is an explanatory view of a second magnetoresistive sensor according to the second embodiment of the present invention viewed along the Z1-Z2 axis. FIG. 11A is a cross-sectional view taken along the line XIA-XIA of FIG. 10A. FIG. 11B is a cross-sectional view taken along the line XIB-XIB of FIG. 10B.

In the present embodiment, components with the same function as in the magnetic sensor 100 illustrated in FIGS. 2 to 4 are denoted by the same reference numerals and letters and are not described here.

As illustrated in FIG. 9, like the magnetic sensor 100, a magnetic sensor 101 includes the full-bridge circuit FB composed of the first half-bridge circuit HB1 and the second half-bridge circuit HB2, and the first magnetoresistive sensor M1 and the second magnetoresistive sensor M2 in each half-bridge circuit are located on the same substrate SB. In the magnetic sensor 101, each magnetoresistive sensor has a fixed magnetization direction P and a bias application direction F different from those of the magnetic sensor 100.

The first magnetoresistive sensor M1 includes the first magnetoresistive film MR1. The first magnetoresistive film MR1 is a tunneling magnetoresistive film including a first pinned magnetic layer 34 with fixed magnetization in the Y1 direction on the Y1-Y2 axis (in the fixed magnetization direction P) and a first free magnetic layer 36 that is easily magnetized along an external magnetic field H applied.

The first pinned magnetic layer 34 and a first pinning antiferromagnetic layer 33 constitute a first pinning exchange coupling film 532. The first pinning antiferromagnetic layer 33 is located on the opposite side of the first pinned magnetic layer 34 from the first free magnetic layer 36 (on a Z2 side on a Z1-Z2 axis). An exchange coupling magnetic field Hex is generated (at the interface) between the first pinned magnetic layer 34 and the first pinning antiferromagnetic layer 33. The fixed magnetization direction P of the first pinned magnetic layer 34 associated with the exchange coupling magnetic field Hex is the Y1 direction on the Y1-Y2 axis, as indicated by black arrows in FIGS. 9, 10A, and 11A.

The first magnetoresistive sensor M1 includes two first magnetic field application bias films MB11 and MB12 to apply a bias magnetic field to the first free magnetic layer 36. The first magnetic field application bias film MB11, the first magnetoresistive film MR1, and the first magnetic field application bias film MB12 are juxtaposed on the substrate SB in this order from the Y1 side to the Y2 side on the Y1-Y2 axis. The first magnetic field application bias film MB11, the first magnetoresistive film MR1, and the first magnetic field application bias film MB12 are located on the substrate SB, shifting their positions from the X2 side to the X1 side on the X1-X2 axis in this order.

As illustrated in FIG. 11A, in each of the first magnetic field application bias films MB11 and MB12, the first ferromagnetic layer 83 and the first biasing antiferromagnetic layer 84 constitute a first biasing exchange coupling film 531 on the underlayer 81 on the substrate SB. An exchange coupling magnetic field Hex in the Y1 direction on the Y1-Y2 axis is generated (at the interface) between the first biasing antiferromagnetic layer 84 and the first ferromagnetic layer 83. The biasing exchange coupling magnetic field Hex11 in the first magnetic field application bias film MB11 and the biasing exchange coupling magnetic field Hex12 in the first magnetic field application bias film MB12 are indicated by hatched arrows in FIGS. 10A and 11A.

The first magnetic field application bias film MB11, the first magnetoresistive film MR1, and the first magnetic field application bias film MB12 are located as described above. Thus, as indicated by white arrows in FIGS. 9, 10A, and 11A, due to the biasing exchange coupling magnetic field Hex11 in the first magnetic field application bias film MB11 and the biasing exchange coupling magnetic field Hex12 in the first magnetic field application bias film MB12, a bias magnetic field (in the bias application direction F) is applied on the X-Y plane at 45 degrees from the Y1 direction on the Y1-Y2 axis toward the X2 direction on the X1-X2 axis (in the X2-Y1 direction). In the absence of the external magnetic field H, the bias magnetic field magnetizes the first free magnetic layer 36 in the bias application direction F.

The second magnetoresistive sensor M2 includes the second magnetoresistive film MR2. The second magnetoresistive film MR2 is a tunneling magnetoresistive film including a second pinned magnetic layer 44 with fixed magnetization in the Y1 direction on the Y1-Y2 axis (in the fixed magnetization direction P) and a second free magnetic layer 46 that is easily magnetized along an external magnetic field H applied.

The second pinned magnetic layer 44 and a second pinning antiferromagnetic layer 43 constitute a second pinning exchange coupling film 542. The second pinning antiferromagnetic layer 43 is located on the opposite side of the second pinned magnetic layer 44 from the second free magnetic layer 46 (on the Z2 side on the Z1-Z2 axis). An exchange coupling magnetic field Hex is generated (at the interface) between the second pinned magnetic layer 44 and the second pinning antiferromagnetic layer 43. The fixed magnetization direction P of the second pinned magnetic layer 44 associated with the exchange coupling magnetic field Hex is the Y1 direction on the Y1-Y2 axis, as indicated by black arrows in FIGS. 9, 10B, and 11B. The fixed magnetization direction P of the first pinned magnetic layer 34 is coaxial with and the same as (parallel to) the fixed magnetization direction P of the second pinned magnetic layer 44.

The second magnetoresistive sensor M2 includes two second magnetic field application bias films MB21 and MB22 to apply a bias magnetic field to the second free magnetic layer 46. The second magnetic field application bias film MB21, the second magnetoresistive film MR2, and the second magnetic field application bias film MB22 are juxtaposed on the substrate SB in this order from the Y1 side to the Y2 side on the Y1-Y2 axis. The second magnetic field application bias film MB21, the second magnetoresistive film MR2, and the second magnetic field application bias film MB22 are located on the substrate SB, shifting their positions from the X1 side to the X2 side on the X1-X2 axis in this order.

As illustrated in FIG. 11B, in each of the second magnetic field application bias films MB21 and MB22, the second ferromagnetic layer 93 and the second biasing antiferromagnetic layer 94 constitute a second biasing exchange coupling film 541 on the underlayer 91 on the substrate SB. An exchange coupling magnetic field Hex in the Y1 direction on the Y1-Y2 axis is generated (at the interface) between the second biasing antiferromagnetic layer 94 and the second ferromagnetic layer 93. A biasing exchange coupling magnetic field Hex21 in the second magnetic field application bias film MB21 and a biasing exchange coupling magnetic field Hex22 in the second magnetic field application bias film MB22 are indicated by hatched arrows in FIGS. 10B and 11B.

The second magnetic field application bias film MB21, the second magnetoresistive film MR2, and the second magnetic field application bias film MB22 are located as described above. Thus, as indicated by white arrows in FIGS. 9, 10B, and 11B, due to the biasing exchange coupling magnetic field Hex21 of the second magnetic field application bias film MB21 and the biasing exchange coupling magnetic field Hex22 of the second magnetic field application bias film MB22, a bias magnetic field (in the bias application direction F) is applied on the X-Y plane at 45 degrees from the Y1 direction on the Y1-Y2 axis toward the X1 direction on the X1-X2 axis (in the X1-Y1 direction). In the absence of the external magnetic field H, the bias magnetic field magnetizes the second free magnetic layer 46 in the bias application direction F. The direction of a bias magnetic field applied to the first free magnetic layer 36 (the bias application direction F) is perpendicular to the direction of a bias magnetic field applied to the second free magnetic layer 46 (the bias application direction F) when viewed along the Z1-Z2 axis.

Thus, the fixed magnetization direction P of the first pinned magnetic layer 34 is parallel to the fixed magnetization direction P of the second pinned magnetic layer 44. The bias application direction F of the first free magnetic layer 36 and the bias application direction F of the second free magnetic layer 46 tilt in the opposite directions relative to the fixed magnetization direction P and are consequently perpendicular to each other when viewed along the Z1-Z2 axis.

Thus, when the application of an external magnetic field H to the magnetic sensor 101 along the X1-X2 axis rotates the magnetization direction of the first free magnetic layer 36 and the magnetization direction of the second free magnetic layer 46 in the direction of the external magnetic field H, these magnetization directions have different relationships with the fixed magnetization direction P (the Y1 direction on the Y1-Y2 axis). For example, for the external magnetic field H in the X2 direction on the X1-X2 axis, both the magnetization direction of the first free magnetic layer 36 and the magnetization direction of the second free magnetic layer 46 rotate counterclockwise in FIG. 9. The rotation makes the magnetization direction of the first free magnetic layer 36 approximately perpendicular to the fixed magnetization direction P (the Y1 direction on the Y1-Y2 axis) and makes the magnetization direction of the second free magnetic layer 46 temporarily parallel to and subsequently perpendicular to the fixed magnetization direction P (the Y1 direction on the Y1-Y2 axis). Thus, immediately after the application of the external magnetic field H, the resistance of the first magnetoresistive sensor M1 increases, but the resistance of the first magnetoresistive sensor M1 decreases. Thus, the differential output (OutX1)–(OutX2) is negative. In contrast, for the external magnetic field H in the X1 direction on the X1-X2 axis, immediately after the application of the external magnetic field H, the resistance of the first magnetoresistive sensor M1 decreases, but the resistance of the first magnetoresistive sensor M1 increases. Thus, the differential output (OutX1)–(OutX2) is positive.

Thus, immediately after the application of the external magnetic field H, the polarity of the differential output (OutX1)–(OutX2) depends on the application direction of the external magnetic field H. An additional use of a feedback coil, for example, can therefore properly control the direction of a coil current that generates a cancellation magnetic field to cancel the external magnetic field H.

As described above, in the magnetic sensor 101, the exchange coupling magnetic field Hex defines magnetization in the three directions: the fixed magnetization direction P in the first magnetoresistive sensor M1 and the second magnetoresistive sensor M2 (the Y2 direction on the Y1-Y2 axis), the bias application direction F in the first magnetoresistive sensor M1 (the X2-Y1 direction), and the bias application direction F in the second magnetoresistive sensor M2 (X1-Y1 direction). To achieve magnetization in the three directions, like the magnetic sensor 100, the magnetic sensor 101 includes three materials with different blocking temperatures as antiferromagnetic layers involved in the generation of the exchange coupling magnetic field Hex.

More specifically, each of the blocking temperature Tbf1 of the first pinning antiferromagnetic layer 33 and the blocking temperature Tbf2 of the second pinning antiferromagnetic layer 43 is higher than the blocking temperature Tb1 of a first biasing antiferromagnetic layer 37 and the blocking temperature Tb2 of a second biasing antiferromagnetic layer 47. The blocking temperature Tb1 of the first biasing antiferromagnetic layer 37 is higher than the blocking temperature Tb2 of the second biasing antiferromagnetic layer 47. Thus, different blocking temperatures can result in exchange coupling magnetic fields in the three different directions.

As illustrated in FIG. 11A, the first magnetoresistive film MR1 formed of the tunneling magnetoresistive film includes a seed layer 32, the first pinning antiferromagnetic layer 33, the first pinned magnetic layer 34, an insulating barrier layer 35, the first free magnetic layer 36, and an upper electrode 38 in this order on a lower electrode 31 located on the substrate SB.

Table 5 shows a specific example of the first magnetoresistive film MR1. In Table 5, the leftmost column indicates each layer of the first magnetoresistive film MR1, and the second column from the right indicates an example of the material of each layer. The numerical values in the rightmost column indicate the thickness of each layer (unit: angstrom (Å)).

TABLE 5

| 38 | Upper electrode | | Ru | 70 |
|---|---|---|---|---|
| | | | Ta | 100 |
| | | | Ru | 50 |
| 36 | First free magnetic layer | Ferromagnetic layer | (50CoFe)B30 | 10 |
| | | Ferromagnetic layer | 50FeCo | 10 |
| 35 | Insulating barrier layer | | MgO | 20 |
| 34 | First pinned magnetic layer | Ferromagnetic layer | 50FeCo | 6 |
| | | Ferromagnetic layer | (50CoFe)B30 | 10 |
| | | Barrier layer | Ta | 3 |
| | | Ferromagnetic layer | 60FeCo | 16 |
| | | Nonmagnetic intermediate layer | Ru | 8 |
| | | Ferromagnetic layer | 90CoFe | 40 |
| 33 | First pinning antiferromagnetic layer | | 20IrMn | 8 |
| | | | 50PtMn | 14 |
| | | | 50PtCr | 300 |

TABLE 5-continued

| 32 | Seed layer | NiFeCr | 42 |
|---|---|---|---|
| 31 | Lower electrode | Ta | 150 |
| | | Cu | 200 |
| | | Ta | 30 |
| | | Cu | 200 |
| | | Ta | 30 |

The lower electrode 31 includes a 30-angstrom Ta layer, a 200-angstrom Cu layer, a 30-angstrom Ta layer, a 200-angstrom Cu layer, and a 150-angstrom Ta layer on the substrate SB.

The seed layer 32 on the lower electrode 31 controls the crystalline orientation of layers formed thereon and is formed of Ru, Ni—Fe—Cr, or the like. In Table 5, the seed layer 32 is a NiFeCr alloy layer 42 angstroms in thickness.

The first pinning antiferromagnetic layer 33 is located on the seed layer 32. A $Pt_{50\ at\ \%}Cr_{50\ at\ \%}$ layer 300 angstroms in thickness, a $Pt_{50\ at\ \%}Mn_{50\ at\ \%}$ layer 14 angstroms in thickness, and an $Ir_{20\ at\ \%}Mn_{80\ at\ \%}$ layer 8 angstroms in thickness are layered on the seed layer 32 in this order to form the first pinning antiferromagnetic layer 33. The first pinning antiferromagnetic layer 33 is annealed for ordering and forms, together with the first pinned magnetic layer 34, the first pinning exchange coupling film 532 by exchange coupling. An exchange coupling magnetic field Hex is generated (at the interface) between the first pinning antiferromagnetic layer 33 and the first pinned magnetic layer 34. The first pinning antiferromagnetic layer 33 has a blocking temperature Tbf1 of approximately 500° C. Thus, the exchange coupling magnetic field Hex is maintained even when the first pinning exchange coupling film 532 is heated to approximately 400° C. The layers to form the first pinning antiferromagnetic layer 33 are formed by sputtering or CVD, for example. In the formation of an alloy layer, such as the PtCr layer, metals for forming the alloy (Pt and Cr for the PtCr layer) may be simultaneously or alternately supplied. For example, metals for forming the alloy may be simultaneously sputtered, or different types of metal films may be alternately stacked. Simultaneous supply of metals for forming the alloy is sometimes preferred rather than alternate supply to increase the exchange coupling magnetic field Hex.

As shown in Table 5, the first pinned magnetic layer 34 has a layered ferri structure composed of a ferromagnetic layer (90CoFe), a nonmagnetic intermediate layer (Ru), and a ferromagnetic layer (50FeCo) located on the first pinning antiferromagnetic layer 33 in this order. The first pinned magnetic layer 34 also includes a barrier layer (Ta) and ferromagnetic layers ((50CoFe)B30 and 50FeCo). As described above, the first pinned magnetic layer 34 has fixed magnetization in one direction (the Y1 direction on the Y1-Y2 axis in FIG. 11A) due to the exchange coupling magnetic field Hex between the first pinned magnetic layer 34 and the first pinning antiferromagnetic layer 33 and due to an RKKY interaction between the two ferromagnetic layers (90CoFe and 60FeCo) on both sides of the nonmagnetic intermediate layer.

The insulating barrier layer 35 is located on the first pinned magnetic layer 34. In the embodiment in Table 5, the insulating barrier layer 35 is a MgO layer 20 angstroms in thickness. The Mg content preferably ranges from 40 to 60 atomic percent. $Mg_{50\ at\ \%}O_{50\ at\ \%}$ is more preferred.

The first free magnetic layer 36 is located on the insulating barrier layer 35. The first free magnetic layer 36 has a layered structure composed of a Co—Fe layer and a Co—Fe—B layer, for example. In the embodiment in Table 5, the first free magnetic layer 36 has a two-layer structure (50FeCo and (50CoFe)B30). The magnetization direction of the first free magnetic layer 36 can be altered on the X-Y plane depending on the direction of the external magnetic field H. To adjust the magnetization direction of the first free magnetic layer 36 in the absence of the external magnetic field H, a bias magnetic field associated with the biasing exchange coupling magnetic field Hex11 in the first biasing exchange coupling film 531 in the first magnetic field application bias film MB11 and the biasing exchange coupling magnetic field Hex12 in the first biasing exchange coupling film 531 in the first magnetic field application bias film MB12 is applied to the first free magnetic layer 36 in the X2-Y1 direction (in the bias application direction F).

The upper electrode 38 is located on the first free magnetic layer 36. In the embodiment in Table 5, the upper electrode 38 includes a Ru layer 50 angstroms in thickness, a Ta layer 100 angstroms in thickness, and a Ru layer 70 angstroms in thickness on the first free magnetic layer 36 in this order.

The specific examples of the first magnetic field application bias films MB11 and MB12 have the same structures as the specific examples of the first magnetic field application bias films MB11 and MB12 in the magnetic sensor 100 according to the first embodiment of the present invention (Table 2) and are not described in detail here.

The first biasing antiferromagnetic layer 84 is located on the first ferromagnetic layer 83. As shown in Table 2, the first biasing antiferromagnetic layer 84 is the $Pt_{50\ at\ \%}Mn_{50\ at\ \%}$ layer 300 angstroms in thickness. The first biasing antiferromagnetic layer 84 is annealed for ordering and forms, together with the first ferromagnetic layer 83, the first biasing exchange coupling film 531 by exchange coupling. The biasing exchange coupling magnetic fields Hex11 and Hex12 are generated (at the interface) between the first biasing antiferromagnetic layer 84 and the first ferromagnetic layer 83. The first biasing antiferromagnetic layer 84 has a blocking temperature Tb1 of approximately 400° C. Thus, the biasing exchange coupling magnetic fields Hex11 and Hex12 are maintained even when the first biasing exchange coupling film 531 is heated to approximately 300° C. Thus, the bias magnetic field associated with the biasing exchange coupling magnetic fields Hex11 and Hex12 applied to the first free magnetic layer 36 in the first magnetoresistive film MR1 is maintained even when the first magnetoresistive sensor M1 is heated to approximately 300° C.

Table 6 shows a specific example of the second magnetoresistive film MR2. In Table 6, the leftmost column indicates each layer of the second magnetoresistive film MR2, and the second column from the right indicates an example of the material of each layer. The numerical values in the rightmost column indicate the thickness of each layer (unit: angstrom (Å)).

TABLE 6

| 48 | | Upper electrode | Ru | 70 |
|---|---|---|---|---|
| | | | Ta | 100 |
| | | | Ru | 50 |
| 46 | Second free | Ferromagnetic layer | (50CoFe)B30 | 10 |
| | magnetic layer | Ferromagnetic layer | 50FeCo | 10 |
| 45 | | Insulating barrier layer | MgO | 20 |

TABLE 6-continued

| 44 | Second pinned magnetic layer | Ferromagnetic layer | 50FeCo | 6 |
|---|---|---|---|---|
|  |  | Ferromagnetic layer | (50CoFe)B30 | 10 |
|  |  | Barrier layer | Ta | 3 |
|  |  | Ferromagnetic layer | 60FeCo | 16 |
|  |  | Nonmagnetic intermediate layer | Ru | 8 |
|  |  | Ferromagnetic layer | 90CoFe | 40 |
| 43 | Second pinning antiferromagnetic layer |  | 20IrMn | 8 |
| 42 | Seed layer |  | 50PtMn | 14 |
| 41 | Lower electrode |  | 50PtCr | 300 |
|  |  |  | NiFeCr | 42 |
|  |  |  | Ta | 150 |
|  |  |  | Cu | 200 |
|  |  |  | Ta | 30 |
|  |  |  | Cu | 200 |
|  |  |  | Ta | 30 |

A lower electrode 41, a seed layer 42, the second pinned magnetic layer 44, an insulating barrier layer 45, the second free magnetic layer 46, and an upper electrode 48 have the same structure as the lower electrode 31, the seed layer 32, the first pinned magnetic layer 34, the insulating barrier layer 35, the first free magnetic layer 36, and the upper electrode 38, respectively, and are not described here.

A $Pt_{50\ at\ \%}Cr_{50\ at\ \%}$ layer 300 angstroms in thickness, a $Pt_{50\ at\ \%}Mn_{50\ at\ \%}$ layer 14 angstroms in thickness, and an $Ir_{20\ at\ \%}Mn_{80\ at\ \%}$ layer 8 angstroms in thickness are layered on the seed layer 42 in this order to form the second pinning antiferromagnetic layer 43. The second pinning antiferromagnetic layer 43 is annealed for ordering and forms, together with the second pinned magnetic layer 44, the second pinning exchange coupling film 542 by exchange coupling. An exchange coupling magnetic field Hex is generated (at the interface) between the second pinning antiferromagnetic layer 43 and the second pinned magnetic layer 44. The second pinning antiferromagnetic layer 43 has a blocking temperature Tbf2 of approximately 500° C. Thus, the exchange coupling magnetic field Hex is maintained even when the second pinning exchange coupling film 542 is heated to approximately 400° C. The layers to form the second pinning antiferromagnetic layer 43 are formed by sputtering or CVD, for example.

The specific examples of the second magnetic field application bias films MB21 and MB22 have the same structures as the specific examples of the second magnetic field application bias films MB21 and MB22 in the magnetic sensor 100 according to the first embodiment of the present invention (Table 4) and are not described in detail here. The second biasing antiferromagnetic layer 94 is located on the second ferromagnetic layer 93. As shown in Table 4, the second biasing antiferromagnetic layer 94 is the $Ir_{20\ at\ \%}Mn_{80\ at\ \%}$ layer 80 angstroms in thickness. The second biasing antiferromagnetic layer 94 and the second ferromagnetic layer 93 form the second biasing exchange coupling film 541 and generate the biasing exchange coupling magnetic fields Hex21 and Hex22 (at the interface) between the second biasing antiferromagnetic layer 94 and the second ferromagnetic layer 93. The second biasing antiferromagnetic layer 47 has a blocking temperature Tb2 of approximately 300° C., which is lower than the blocking temperature Tb1 of the first biasing antiferromagnetic layer (approximately 400° C.)

Thus, the magnetic sensor 101 includes the three antiferromagnetic layers with different blocking temperatures Tbs. In the magnetic sensor 101 produced by forming and heating each layer as described below, therefore, each magnetoresistive sensor (the first magnetoresistive sensor M1, the second magnetoresistive sensor M2) can have a fixed magnetization direction P and a bias application direction F in predetermined directions.

First, the layers of the first magnetoresistive film MR1 and the layers of the second magnetoresistive film MR2 are stacked and subjected to the fixed magnetization axis setting step. In this step, the first pinning antiferromagnetic layer 33 and the second pinning antiferromagnetic layer 43 are ordered by heat treatment.

Any ordering temperature may be used. The ordering temperature is typically slightly lower than the blocking temperature Tbf1 of the first pinning antiferromagnetic layer 33 and the blocking temperature Tbf2 of the second pinning antiferromagnetic layer 43, for example, approximately 300° C. to 400° C. The heat-treatment time may also be any time, provided that the ordering can be achieved. For example, the heat-treatment time may be, but is limited to, one hour or more, more specifically approximately five hours.

Thus, the first pinning antiferromagnetic layer 33 and the second pinning antiferromagnetic layer 43 are ordered, and an exchange coupling magnetic field Hex is generated in the first pinning exchange coupling film 532 and the second pinning exchange coupling film 542. In the ordering, the magnetization direction of the first pinning antiferromagnetic layer 33 is adjusted to the magnetization direction of the first pinned magnetic layer 34. Thus, the exchange coupling magnetic field Hex in the first pinning exchange coupling film 532 is generated in the magnetization direction of the first pinned magnetic layer 34. In the ordering, the magnetization direction of the second pinning antiferromagnetic layer 43 is adjusted to the magnetization direction of the second pinned magnetic layer 44. Thus, the exchange coupling magnetic field Hex in the second pinning exchange coupling film 542 is generated in the magnetization direction of the second pinned magnetic layer 44.

Thus, setting the magnetization directions of the first pinned magnetic layer 34 and the second pinned magnetic layer 44 in the Y1 direction on the Y1-Y2 axis during the formation of the first pinned magnetic layer 34 and the second pinned magnetic layer 44 can make the fixed magnetization direction P of the first pinned magnetic layer 15 coaxial with (more specifically, parallel to) the fixed magnetization direction P of the second pinned magnetic layer 25 in the fixed magnetization axis setting step. In the magnetic sensor 100 according to the first embodiment, different film formation processes are required due to antiparallel magnetization directions of the first pinned magnetic layer 15 and the second pinned magnetic layer 25. In the magnetic sensor 101 according to the second embodiment, however, the first pinned magnetic layer 34 and the second pinned magnetic layer 44 can be formed by the same film formation process.

After the fixed magnetization axes of the first magnetoresistive film MR1 and the second magnetoresistive film MR2 are set as described above, the layers of the two first magnetic field application bias films MB11 and MB12 are juxtaposed to the first magnetoresistive film MR1, and the layers of the two second magnetic field application bias films MB21 and MB22 are juxtaposed to the second magnetoresistive film MR2.

Subsequently, in the first bias magnetic field setting step, heat treatment is performed at a temperature lower than the blocking temperature Tbf1 of the first pinning antiferromagnetic layer 33 and the blocking temperature Tbf2 of the second pinning antiferromagnetic layer 43 (for example, 350° C.). In the heat treatment, application of an external magnetic field in the Y1 direction on the Y1-Y2 axis generates the biasing exchange coupling magnetic fields Hex11 and Hex12 in the external magnetic field direction between the first biasing antiferromagnetic layer 84 and the first ferromagnetic layer 83 in the first magnetic field application bias films MB11 and MB12. Due to these biasing exchange coupling magnetic fields Hex11 and Hex12, a bias magnetic field is applied to the first free magnetic layer 36 in the X2-Y1 direction (in the bias application direction F). The bias application direction F of the first free magnetic layer 36 is nonparallel to the fixed magnetization direction P of the first pinned magnetic layer 34 and, more specifically, is tilted 45 degrees in the X2 direction on the X1-X2 axis when viewed along the Z1-Z2 axis.

The heat-treatment temperature in the first bias magnetic field setting step is lower than the blocking temperature Tbf1 of the first pinning antiferromagnetic layer 33 and the blocking temperature Tbf2 of the second pinning antiferromagnetic layer 43. Thus, the fixed magnetization direction P in the first pinned magnetic layer 34 and the fixed magnetization direction P in the second pinned magnetic layer 44 are not changed to the direction of the applied external magnetic field and are maintained. Although an exchange coupling magnetic field Hex is generated between the second biasing antiferromagnetic layer 47 and the second free magnetic layer 46 in the first bias magnetic field setting step, the direction of the exchange coupling magnetic field Hex between the second biasing antiferromagnetic layer 47 and the second free magnetic layer 46 can be chosen freely in a second bias magnetic field setting step described below.

Finally, in the second bias magnetic field setting step, heat treatment is performed at a temperature lower than the blocking temperature Tb1 of the first biasing antiferromagnetic layer 37 (for example, 300° C.). In the heat treatment, application of an external magnetic field in the Y1 direction on the Y1-Y2 axis generates the biasing exchange coupling magnetic fields Hex21 and Hex22 in the magnetic field direction between the second biasing antiferromagnetic layer 94 and the second ferromagnetic layer 93 in the second magnetic field application bias films MB21 and MB22. Due to these biasing exchange coupling magnetic fields Hex21 and Hex22, a bias magnetic field is applied to the second free magnetic layer 46 in the X1-Y1 direction (in the bias application direction F). The bias application direction F of the second free magnetic layer 46 is nonparallel to the fixed magnetization direction P of the second pinned magnetic layer 44 and, more specifically, is tilted 45 degrees in the X1 direction on the X1-X2 axis when viewed along the Z1-Z2 axis.

The heat-treatment temperature in the second bias magnetic field setting step is lower than the blocking temperature Tbf1 of the first pinning antiferromagnetic layer 33, the blocking temperature Tbf2 of the second pinning antiferromagnetic layer 43, and the blocking temperature Tb1 of the first biasing antiferromagnetic layer 37. Thus, the fixed magnetization direction P in the first pinned magnetic layer 34, the fixed magnetization direction P in the second pinned magnetic layer 44, and the direction of a bias magnetic field applied to the first free magnetic layer 36 (the bias application direction F) are not changed to the direction of the magnetic field applied and are maintained.

Thus, when the magnetic sensor 101 includes the three antiferromagnetic layers with different blocking temperatures Tbs, the above step can generate an exchange coupling magnetic field Hex in any direction in the ferromagnetic layers exchange-coupled with the antiferromagnetic layers (the first pinned magnetic layer 34, the second pinned magnetic layer 44, the first free magnetic layer 36, and the second free magnetic layer 46).

These embodiments are described to facilitate the understanding of the present invention and do not limit the present invention. Thus, the components disclosed in the embodiments encompass all design changes and equivalents thereof that fall within the technical scope of the present invention.

For example, in the magnetic sensor 100 according to the first embodiment, the fixed magnetization direction P is perpendicular to the bias application direction F in each of the first magnetoresistive sensor M1 and the second magnetoresistive sensor M2, the fixed magnetization direction P in the first magnetoresistive sensor M1 is antiparallel to the fixed magnetization direction P in the second magnetoresistive sensor M2, and the bias application direction F in the first magnetoresistive sensor M1 is parallel to the bias application direction F in the second magnetoresistive sensor M2. As in the magnetic sensor 101 according to the second embodiment, however, the fixed magnetization direction P in the first magnetoresistive sensor M1 may be parallel to the fixed magnetization direction P in the second magnetoresistive sensor M2, and the bias application direction F in the first magnetoresistive sensor M1 and the bias application direction F in the second magnetoresistive sensor M2 may be tilted in the opposite directions relative to the fixed magnetization direction P and may be perpendicular to each other. The relationship between the fixed magnetization direction P and the bias application direction F of the magnetic sensor 101 according to the second embodiment may be the same as in the magnetic sensor 100 according to the first embodiment.

Although the first magnetoresistive film MR1 and the second magnetoresistive film MR2 in the magnetic sensor 100 according to the first embodiment are giant magnetoresistive films, they may be tunneling magnetoresistive films as in the second embodiment. Although the first magnetoresistive film MR1 and the second magnetoresistive film MR2 in the magnetic sensor 101 according to the second embodiment are tunneling magnetoresistive films, they may be giant magnetoresistive films as in the first embodiment.

Although the first magnetoresistive film MR1 and the second magnetoresistive film MR2 in the magnetic sensor 100 according to the first embodiment have a top-pinned structure, which includes a free magnetic layer near the substrate SB, they may have a bottom-pinned structure, which has a pinned magnetic layer near the substrate SB, as in the second embodiment. Although the first magnetoresistive film MR1 and the second magnetoresistive film MR2 in the magnetic sensor 101 according to the second embodiment have the bottom-pinned structure, which includes a pinned magnetic layer near the substrate SB, they may have the top-pinned structure, which has a free magnetic layer near the substrate SB, as in the first embodiment.

Although the free magnetic layer and the pinned magnetic layer in the magnetic sensor 100 according to the first embodiment and the magnetic sensor 101 according to the second embodiment have a multilayer structure, one or both of the free magnetic layer and the pinned magnetic layer may have a monolayer structure.

Figure 12A:
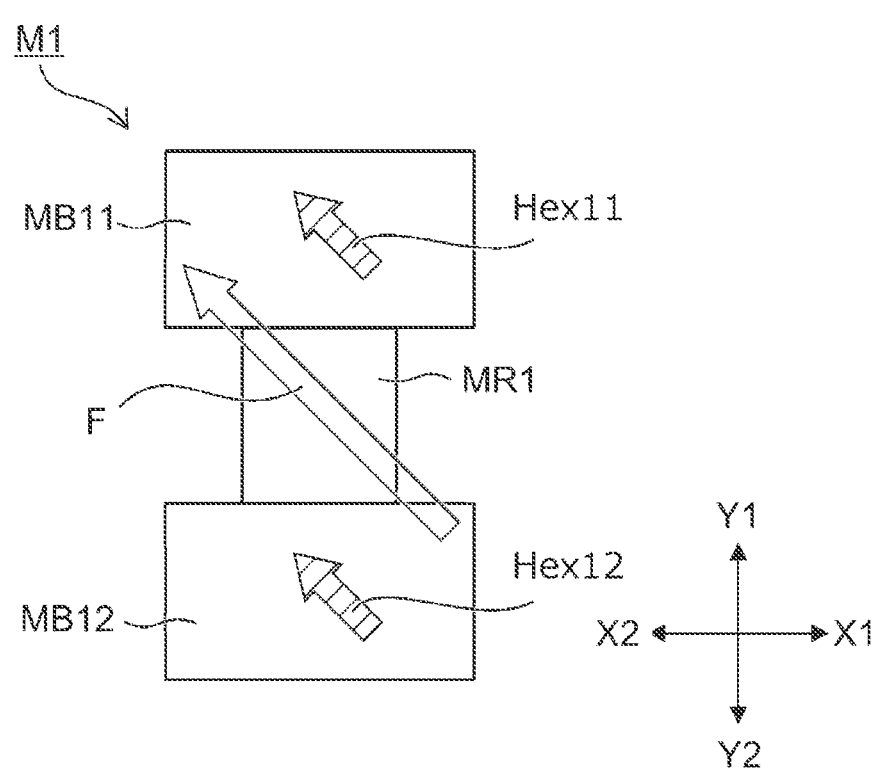
FIG. 12A is an explanatory view of a magnetoresistive sensor according to a modified example of the second embodiment of the present invention.
Figure 12B:
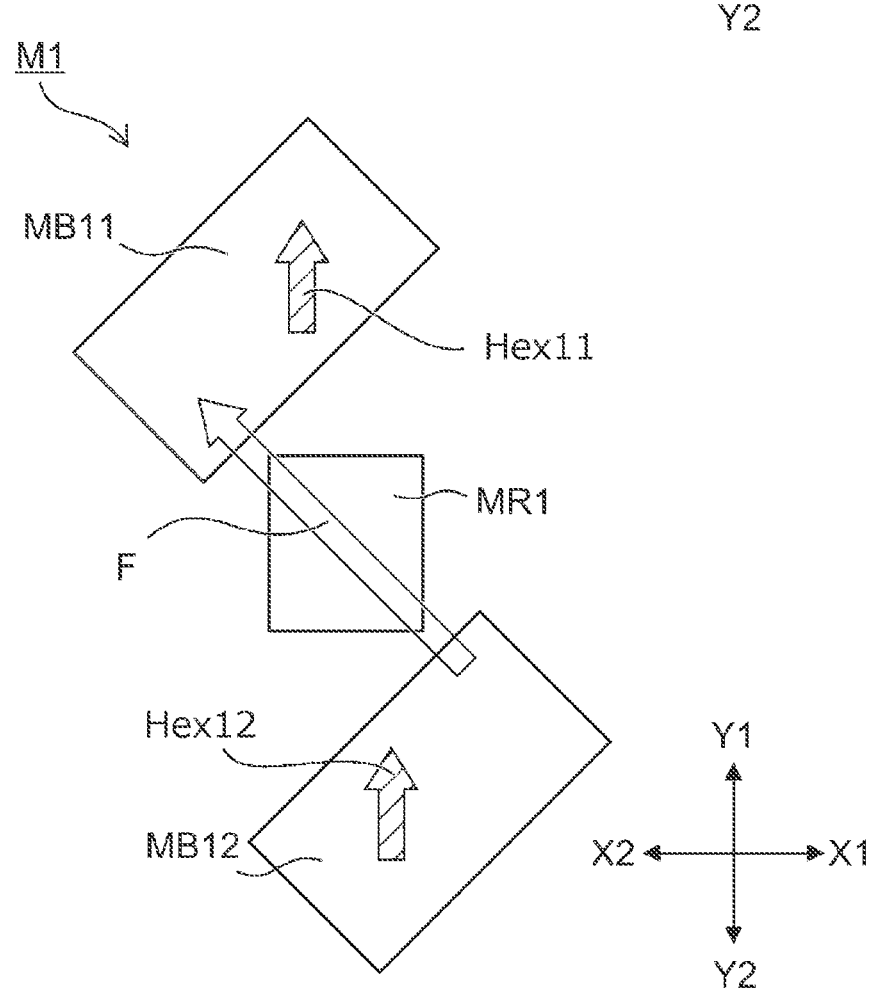
FIG. 12B is an explanatory view of a magnetoresistive sensor according to another modified example of the second embodiment of the present invention.

In the magnetic sensor 101 according to the second embodiment, although the positions of the first magnetic field application bias film MB11 and the first magnetic field application bias film MB12 are shifted in opposite directions on the X1-X2 axis relative to the Y1-Y2 axis to set the bias application direction F in the X2-Y1 direction, the bias application direction F may be set in the X2-Y1 direction by another method, as illustrated in FIGS. 12A and 12B. FIG.

12A is an explanatory view of a magnetoresistive sensor according to a modified example of the second embodiment of the present invention. FIG. 12B is an explanatory view of a magnetoresistive sensor according to another modified example of the second embodiment of the present invention.

In FIG. 12A, the first magnetic field application bias film MB11, the first magnetoresistive film MR1, and the first magnetic field application bias film MB12 are juxtaposed in this order from the Y1 side to the Y2 side on the Y1-Y2 axis, thereby setting the biasing exchange coupling magnetic field Hex11 in the first magnetic field application bias film MB11 and the biasing exchange coupling magnetic field Hex12 in the first magnetic field application bias film MB12 in the X2-Y1 direction and setting the bias application direction F in the X2-Y1 direction. In such a structure, to facilitate the setting of the direction of the bias magnetic field applied to the first magnetoresistive film MR1, the length of each of the first magnetic field application bias film MB11 and the first magnetic field application bias film MB12 on the X1-X2 axis is preferably longer than the length on the X1-X2 axis of the first magnetoresistive film MR1 interposed therebetween.

In FIG. 12B, although the biasing exchange coupling magnetic field Hex11 in the first magnetic field application bias film MB11 and the biasing exchange coupling magnetic field Hex12 in the first magnetic field application bias film MB12 are in the Y1 direction on the Y1-Y2 axis, the distance from the first magnetoresistive film MR1 to each of the first magnetic field application bias film MB11 and the first magnetic field application bias film MB12 juxtaposed to the first magnetoresistive film MR1 along the Y1-Y2 axis is varied along the X1-X2 axis to set the bias application direction F in the X2-Y1 direction. More specifically, as compared with the structure in FIG. 12A, the first magnetic field application bias film MB11 and the first magnetic field application bias film MB12 are tilted counterclockwise. Thus, the distance between the first magnetic field application bias film MB11 and the first magnetoresistive film MR1 decreases in the X2 direction on the X1-X2 axis. The bias magnetic field applied to the first free magnetic layer 36 therefore increases in the X2 direction on the X1-X2 axis. The distance between the first magnetic field application bias film MB12 and the first magnetoresistive film MR1 decreases in the X1 direction on the X1-X2 axis, and therefore the bias magnetic field applied to the first free magnetic layer 36 increases in the X1 direction on the X1-X2 axis. Consequently, as illustrated in FIG. 12B, the bias application direction F in the first magnetoresistive film MR1 is tilted counterclockwise relative to the Y1 direction on the Y1-Y2 axis (in the X2 direction on the X1-X2 axis).

EXAMPLES

Although the present invention is more specifically described in the following examples, the scope of the present invention is not limited to these examples.

Example 1

A multilayer film with the following structure was formed to examine the relationship between the intensity of an exchange coupling magnetic field Hex and the ambient temperature. Each numerical value in parentheses indicates the thickness of the corresponding layer (unit: angstroms).

Substrate/underlayer: NiFeCr (42)/antiferromagnetic layer/pinned magnetic layer: 90CoFe (100)/protective layer: Ta (90)

In the present example, the antiferromagnetic layer had a multilayer structure of 54PtCr (280)/50PtMn (20) located on the underlayer in this order. The multilayer film was annealed in a 1-kOe magnetic field at 400° C. for 5 hours, and the magnetization of each of the pinned magnetic layer and the antiferromagnetic layer was fixed to form an exchange coupling film.

Example 2

The multilayer structure of the antiferromagnetic layer in Example 1 was changed to 50PtMn (300). The multilayer film was annealed in a 1-kOe magnetic field at 300° C. for 4 hours, and the magnetization of each of the pinned magnetic layer and the antiferromagnetic layer was fixed to form an exchange coupling film.

Example 3

The multilayer structure of the antiferromagnetic layer in Example 1 was changed to 20IrMn (80). The multilayer film was annealed in a 1-kOe magnetic field at 300° C. for 1 hour, and the magnetization of each of the pinned magnetic layer and the antiferromagnetic layer was fixed to form an exchange coupling film.

Figure 13:
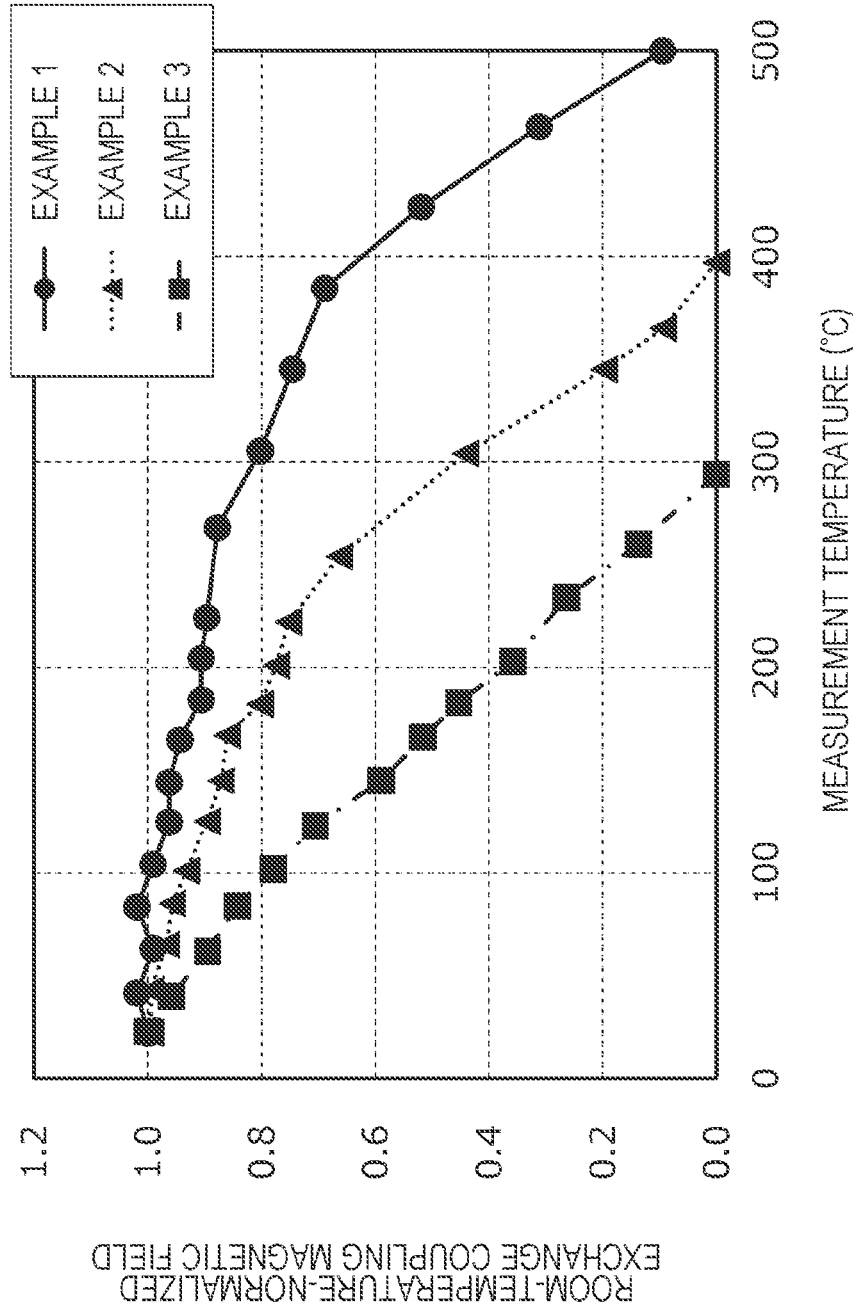
FIG. 13 is a graph of the temperature dependence of the intensity of an exchange coupling magnetic field Hex.

Magnetization curves of the exchange coupling films according to Examples 1 to 3 were obtained with a vibrating sample magnetometer (VSM) at different ambient temperatures (unit: ° C.). The exchange coupling magnetic field Hex (unit: Oe) was determined at each temperature from the resulting hysteresis loop. Tables 7 to 9 list the exchange coupling magnetic field Hex at each temperature and the exchange coupling magnetic field Hex at each temperature normalized with respect to the exchange coupling magnetic field Hex at room temperature (a room-temperature-normalized exchange coupling magnetic field). FIG. 13 is a graph of the relationship between the room-temperature-normalized exchange coupling magnetic field and the measurement temperature.

TABLE 7

| Example 1 | | |
| --- | --- | --- |
| Temperature (° C.) | Hex (Oe) | Normalized Hex |
| 22 | 530 | 1.00 |
| 42 | 540 | 1.02 |
| 63 | 525 | 0.99 |
| 84 | 540 | 1.02 |
| 104 | 525 | 0.99 |
| 125 | 510 | 0.96 |
| 144 | 510 | 0.96 |
| 165 | 500 | 0.94 |
| 184 | 480 | 0.91 |
| 204 | 480 | 0.91 |
| 224 | 475 | 0.90 |
| 268 | 465 | 0.88 |
| 305 | 425 | 0.80 |
| 345 | 395 | 0.75 |
| 385 | 365 | 0.69 |
| 424 | 275 | 0.52 |
| 463 | 165 | 0.31 |
| 500 | 50 | 0.09 |

TABLE 8

Example 2

| Temperature (° C.) | Hex (Oe) | Normalized Hex |
|---|---|---|
| 22 | 278 | 0.99 |
| 43 | 278 | 0.99 |
| 65 | 270 | 0.97 |
| 85 | 267 | 0.96 |
| 101 | 260 | 0.93 |
| 125 | 250 | 0.90 |
| 145 | 243 | 0.87 |
| 167 | 240 | 0.86 |
| 182 | 224 | 0.80 |
| 201 | 216 | 0.77 |
| 222 | 210 | 0.75 |
| 254 | 185 | 0.66 |
| 304 | 123 | 0.44 |
| 345 | 55 | 0.20 |
| 365 | 26 | 0.09 |
| 397 | 0 | 0.00 |

TABLE 9

Example 3

| Temperature (° C.) | Hex (Oe) | Normalized Hex |
|---|---|---|
| 23 | 95 | 1.00 |
| 40 | 91 | 0.96 |
| 62 | 85 | 0.89 |
| 84 | 80 | 0.84 |
| 102 | 74 | 0.78 |
| 123 | 67 | 0.71 |
| 145 | 56 | 0.59 |
| 166 | 49 | 0.52 |
| 183 | 43 | 0.45 |
| 203 | 34 | 0.36 |
| 234 | 25 | 0.26 |
| 260 | 13 | 0.14 |
| 294 | 0 | 0.00 |

Tables 7 to 9 and FIG. 13 show that the exchange coupling films according to Examples 1 to 3 differently maintain the exchange coupling magnetic field Hex at each ambient temperature. In particular, the exchange coupling film with the multilayer antiferromagnetic layer according to Example 1 can maintain the exchange coupling magnetic field Hex even at a temperature in the range of 350° C. to 400° C., at which the exchange coupling films according to Examples 2 and 3 substantially lose the exchange coupling magnetic field Hex.

What is claimed is:

1. A magnetic detector comprising a full-bridge circuit including a first magnetoresistive sensor and a second magnetoresistive sensor, the first magnetoresistive sensor including a first magnetoresistive film and a first magnetic field application bias film, the first magnetoresistive film including a first pinned magnetic layer and a first free magnetic layer, the first magnetic field application bias film being configured to apply a bias magnetic field to the first free magnetic layer, the second magnetoresistive sensor including a second magnetoresistive film and a second magnetic field application bias film, the second magnetoresistive film including a second pinned magnetic layer and a second free magnetic layer, the second magnetic field application bias film being configured to apply a bias magnetic field to the second free magnetic layer, wherein:

the full-bridge circuit includes a first half-bridge circuit and a second half-bridge circuit connected in parallel between a power supply terminal and a ground terminal, the first half-bridge circuit including the first magnetoresistive sensor and the second magnetoresistive sensor connected in series, the second half-bridge circuit including the second magnetoresistive sensor and the first magnetoresistive sensor connected in series, the first magnetoresistive sensor and the second magnetoresistive sensor are located on the same substrate, the first magnetoresistive film has a first pinning exchange coupling film including the first pinned magnetic layer and a first pinning antiferromagnetic layer, the first magnetic field application bias film has a first biasing exchange coupling film including a first ferromagnetic layer and a first biasing antiferromagnetic layer, the second magnetoresistive film has a second pinning exchange coupling film including the second pinned magnetic layer and a second pinning antiferromagnetic layer, the second magnetic field application bias film has a second biasing exchange coupling film including a second ferromagnetic layer and a second biasing antiferromagnetic layer, the first pinned magnetic layer has a fixed magnetization axis coaxial with a fixed magnetization axis of the second pinned magnetic layer, the first biasing exchange coupling film has an exchange coupling magnetic field direction nonparallel to a fixed magnetization axis direction of the first pinned magnetic layer, and the second biasing exchange coupling film has an exchange coupling magnetic field direction nonparallel to a fixed magnetization axis direction of the second pinned magnetic layer, each of a blocking temperature Tbf1 of the first pinning antiferromagnetic layer and a blocking temperature Tbf2 of the second pinning antiferromagnetic layer is higher than a blocking temperature Tb1 of the first biasing antiferromagnetic layer and a blocking temperature Tb2 of the second biasing antiferromagnetic layer, and the blocking temperature Tb1 of the first biasing antiferromagnetic layer is higher than the blocking temperature Tb2 of the second biasing antiferromagnetic layer.

2. The magnetic detector according to claim 1, wherein:

the fixed magnetization axis direction of the first pinned magnetic layer is antiparallel to the fixed magnetization axis direction of the second pinned magnetic layer, the first biasing antiferromagnetic layer has an exchange coupling magnetic field direction parallel to an exchange coupling magnetic field direction of the second biasing antiferromagnetic layer, and the fixed magnetization axis direction of the first pinned magnetic layer is nonparallel to the exchange coupling magnetic field direction of the first biasing antiferromagnetic layer.

3. The magnetic detector according to claim 1, wherein:

the fixed magnetization axis direction of the first pinned magnetic layer is parallel to the fixed magnetization axis direction of the second pinned magnetic layer, and the first biasing exchange coupling film has a bias magnetic field direction nonparallel to a bias magnetic field direction of the second biasing exchange coupling film.

4. The magnetic detector according to claim 3, wherein a tilt angle of the bias magnetic field direction of the first biasing exchange coupling film relative to the fixed magnetization axis direction of the first pinned magnetic layer viewed in a stacking direction is oppositelydirected to and has the same absolute value as a tilt angle of the bias magnetic field direction of the second biasing exchange coupling film relative to the fixed magnetization axis direction of the second pinned magnetic layer viewed in the stacking direction.

5. The magnetic detector according to claim 1, wherein:
at least one of the first pinning antiferromagnetic layer and the second pinning antiferromagnetic layer includes an X(Cr—Mn) layer containing one or two or more elements X selected from the group consisting of platinum group elements and Ni and containing Mn and Cr,
the X(Cr—Mn) layer has a first region located relatively near a pinning ferromagnetic layer exchange-coupled with the pinning antiferromagnetic layer and a second region located relatively far from the pinning ferromagnetic layer, and
the first region has a higher Mn content than the second region.

6. The magnetic detector according to claim 5, wherein the first region is in contact with the pinning ferromagnetic layer.

7. The magnetic detector according to claim 5, wherein the first region has a portion with a Mn/Cr ratio of 0.3 or more, the Mn/Cr ratio being a ratio of the Mn content to a Cr content.

8. The magnetic detector according to claim 7, wherein the first region has a portion with a Mn/Cr ratio of 1 or more.

9. The magnetic detector according to claim 5, wherein the pinning antiferromagnetic layer includes a PtCr layer and an $X^0$Mn layer located nearer the pinning ferromagnetic layer than the PtCr layer (wherein $X^0$ denotes one or two or more elements selected from the group consisting of platinum group elements and Ni).

10. The magnetic detector according to claim 5, wherein the pinning antiferromagnetic layer includes a PtCr layer and a PtMn layer, the PtMn layer being located nearer the pinning ferromagnetic layer.

11. The magnetic detector according to claim 10, further comprising
an IrMn layer located nearer the pinning ferromagnetic layer than the PtMn layer.

12. The magnetic detector according to claim 1, wherein
at least one of the first pinning antiferromagnetic layer and the second pinning antiferromagnetic layer has an alternately layered structure of alternately stacked three or more layers composed of an $X^1$Cr layer (wherein $X^1$ denotes one or two or more elements selected from the group consisting of platinum group elements and Ni) and an $X^2$Mn layer (wherein $X^2$ denotes one or two or more elements selected from the group consisting of platinum group elements and Ni and may be the same as or different from $X^1$).

13. The magnetic detector according to claim 12, wherein $X^1$ is Pt, and $X^2$ is Pt or Ir.

14. The magnetic detector according to claim 12, wherein the pinning antiferromagnetic layer includes a unit layered portion including a stack of units composed of the $X^1$Cr layer and the $X^2$Mn layer.

15. The magnetic detector according to claim 14, wherein in the unit layered portion, the $X^1$Cr layers have the same thickness, and the $X^2$Mn layers have the same thickness, the $X^1$Cr layers having a larger thickness than the $X^2$Mn layers.

16. The magnetic detector according to claim 15, wherein a ratio of the thickness of the $X^1$Cr layer to the thickness of the $X^2$Mn layer ranges from 5:1 to 100:1.

17. The magnetic detector according to claim 4, wherein the first biasing antiferromagnetic layer is a PtMn layer, and the second biasing antiferromagnetic layer is an IrMn layer.

18. A method for producing a magnetic detector including a full-bridge circuit including a first magnetoresistive sensor and a second magnetoresistive sensor, the first magnetoresistive sensor including a first magnetoresistive film and a first magnetic field application bias film, the first magnetoresistive film including a first pinned magnetic layer and a first free magnetic layer, the first magnetic field application bias film being configured to apply a bias magnetic field to the first free magnetic layer, the second magnetoresistive sensor including a second magnetoresistive film and a second magnetic field application bias film, the second magnetoresistive film including a second pinned magnetic layer and a second free magnetic layer, the second magnetic field application bias film being configured to apply a bias magnetic field to the second free magnetic layer, wherein:
the full-bridge circuit includes a first half-bridge circuit and a second half-bridge circuit connected in parallel between a power supply terminal and a ground terminal, the first half-bridge circuit including the first magnetoresistive sensor and the second magnetoresistive sensor connected in series, the second half-bridge circuit including the second magnetoresistive sensor and the first magnetoresistive sensor connected in series,
the first magnetoresistive sensor and the second magnetoresistive sensor are located on the same substrate,
the first magnetoresistive film has a first pinning exchange coupling film including the first pinned magnetic layer and a first pinning antiferromagnetic layer,
the first magnetic field application bias film has a first biasing exchange coupling film including a first ferromagnetic layer and a first biasing antiferromagnetic layer,
the second magnetoresistive film has a second pinning exchange coupling film including the second pinned magnetic layer and a second pinning antiferromagnetic layer,
the second magnetic field application bias film has a second biasing exchange coupling film including a second ferromagnetic layer and a second biasing antiferromagnetic layer,
each of a blocking temperature Tbf1 of the first pinning antiferromagnetic layer and a blocking temperature Tbf2 of the second pinning antiferromagnetic layer is higher than a blocking temperature Tb1 of the first biasing antiferromagnetic layer and a blocking temperature Tb2 of the second biasing antiferromagnetic layer, and
the blocking temperature Tb1 of the first biasing antiferromagnetic layer is higher than the blocking temperature Tb2 of the second biasing antiferromagnetic layer,
the method comprising:
setting a fixed magnetization axis by ordering the first pinning antiferromagnetic layer and the second pinning antiferromagnetic layer by heat treatment to generate an exchange coupling magnetic field in the first biasing exchange coupling film and in the second biasing exchange coupling film, thereby making a fixed magnetization axis of the first pinned magnetic layer coaxial with a fixed magnetization axis of the second pinned magnetic layer, setting a first bias magnetic field by making a direction of a bias magnetic field generated by the first biasing exchange coupling film nonparallel to a fixed magnetization axis direction of the first pinned magnetic layer by heat treatment in an external magnetic field at a temperature lower than a blocking temperature Tbf1 of the first pinning antiferromagnetic layer and a blocking temperature Tbf2 of the second pinning antiferromagnetic layer, and after setting the first bias magnetic field, setting a second bias magnetic field by making a direction of a bias magnetic field generated by the second biasing exchange coupling film nonparallel to a fixed magnetization axis direction of the second pinned magnetic layer by heat treatment in an external magnetic field at a temperature lower than the blocking temperature Tb1 of the first biasing antiferromagnetic layer.

19. The method for producing a magnetic detector according to claim 18, wherein setting the fixed magnetization axis includes adjusting an exchange coupling magnetic field direction of the first pinning exchange coupling film to a magnetization direction of the first pinned magnetic layer and adjusting an exchange coupling magnetic field direction of the second pinning exchange coupling film to a magnetization direction of the second pinned magnetic layer.

20. The method for producing a magnetic detector according to claim 18, wherein setting the fixed magnetization axis includes making the fixed magnetization axis direction of the first pinned magnetic layer antiparallel to the fixed magnetization axis direction of the second pinned magnetic layer, setting the first bias magnetic field includes making the exchange coupling magnetic field direction of the first biasing antiferromagnetic layer nonparallel to the fixed magnetization axis direction of the first pinned magnetic layer, and setting the second bias magnetic field includes making an exchange coupling magnetic field direction of the second biasing antiferromagnetic layer parallel to the exchange coupling magnetic field direction of the first biasing antiferromagnetic layer.

21. The method for producing a magnetic detector according to claim 18, wherein:

setting the fixed magnetization axis includes making the fixed magnetization axis direction of the first pinned magnetic layer parallel to the fixed magnetization axis direction of the second pinned magnetic layer, setting the first bias magnetic field includes making a bias magnetic field direction of the first biasing exchange coupling film nonparallel to the fixed magnetization axis direction of the first pinned magnetic layer, and setting the second bias magnetic field includes making a bias magnetic field direction of the second biasing exchange coupling film nonparallel to both the fixed magnetization axis direction of the first pinned magnetic layer and the bias magnetic field direction of the first biasing exchange coupling film.

* * * * *